United States Patent
Zhamu et al.

(10) Patent No.: US 10,163,540 B2
(45) Date of Patent: Dec. 25, 2018

(54) PRODUCTION PROCESS FOR HIGHLY CONDUCTING AND ORIENTED GRAPHENE FILM

(71) Applicant: Nanotek Instruments, Inc., Dayton, OH (US)

(72) Inventors: Aruna Zhamu, Springboro, OH (US); Bor Z Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 0 days.

(21) Appl. No.: 14/757,194

(22) Filed: Dec. 3, 2015

(65) Prior Publication Data

US 2017/0162291 A1    Jun. 8, 2017

(51) Int. Cl.

| | |
|---|---|
| C23C 16/00 | (2006.01) |
| H01B 1/04 | (2006.01) |
| C23C 14/06 | (2006.01) |
| C23C 16/26 | (2006.01) |
| C23C 18/16 | (2006.01) |
| C25D 5/54 | (2006.01) |
| C01B 32/184 | (2017.01) |
| C01B 32/19 | (2017.01) |
| C25D 3/22 | (2006.01) |
| C23C 18/40 | (2006.01) |

(52) U.S. Cl.
CPC ............ *H01B 1/04* (2013.01); *C01B 32/184* (2017.08); *C01B 32/19* (2017.08); *C23C 14/0605* (2013.01); *C23C 16/26* (2013.01); *C23C 18/1633* (2013.01); *C23C 18/1644* (2013.01); *C25D 5/54* (2013.01); *C23C 18/40* (2013.01); *C25D 3/22* (2013.01)

(58) Field of Classification Search
USPC ....................................................... 427/122
See application file for complete search history.

(56) References Cited

U.S. PATENT DOCUMENTS

| 7,071,258 B1 | 7/2006 | Jang et al. |
| 7,759,008 B2 | 7/2010 | Barker et al. |

(Continued)

OTHER PUBLICATIONS

U.S. Appl. No. 10/858,814, filed Jun. 3, 2004, B. Z. Jang, et al.

(Continued)

*Primary Examiner* — Brian K Talbot

(57) ABSTRACT

A process for producing a highly conducting film of conductor-bonded graphene sheets that are highly oriented, comprising: (a) preparing a graphene dispersion or graphene oxide (GO) gel; (b) depositing the dispersion or gel onto a supporting solid substrate under a shear stress to form a wet layer; (c) drying the wet layer to form a dried layer having oriented graphene sheets or GO molecules with an inter-planar spacing $d_{002}$ of 0.4 nm to 1.2 nm; (d) heat treating the dried layer at a temperature from 55° C. to 3,200° C. for a desired length of time to produce a porous graphitic film having pores and constituent graphene sheets or a 3D network of graphene pore walls having an inter-planar spacing $d_{002}$ less than 0.4 nm; and (e) impregnating the porous graphitic film with a conductor material that bonds the constituent graphene sheets or graphene pore walls to form the conducting film.

34 Claims, 27 Drawing Sheets

(56) References Cited

U.S. PATENT DOCUMENTS

| | | |
|---|---|---|
| 2004/0121237 A1 | 6/2004 | Kelley et al. |
| 2004/0191617 A1 | 9/2004 | Visco et al. |
| 2004/0241545 A1 | 12/2004 | Ochiai et al. |
| 2005/0238961 A1 | 10/2005 | Barker et al. |
| 2005/0271574 A1 | 12/2005 | Jang et al. |
| 2008/0020193 A1* | 1/2008 | Jang ............... B29C 70/025 428/292.1 |
| 2008/0048152 A1 | 2/2008 | Jang et al. |
| 2008/0248275 A1 | 10/2008 | Jang et al. |
| 2009/0061312 A1* | 3/2009 | Zhamu ............... H01G 11/34 429/217 |
| 2010/0062341 A1 | 3/2010 | Hambitzer |
| 2010/0266907 A1 | 10/2010 | Yazami |
| 2010/0317790 A1* | 12/2010 | Jang ............... B82Y 30/00 524/496 |
| 2012/0171574 A1 | 7/2012 | Zhamu et al. |
| 2013/0059174 A1 | 3/2013 | Zhamu |
| 2013/0202959 A1 | 8/2013 | Chiang et al. |
| 2013/0319870 A1 | 12/2013 | Chen et al. |
| 2013/0344397 A1 | 12/2013 | Visco et al. |
| 2014/0147648 A1 | 5/2014 | Zhamu et al. |
| 2014/0154941 A1* | 6/2014 | Zhamu ............... H01B 1/04 442/136 |
| 2014/0190676 A1* | 7/2014 | Zhamu ............... F28F 21/02 165/185 |
| 2014/0308449 A1* | 10/2014 | Zhamu ............... C01B 31/04 427/372.2 |
| 2014/0363746 A1 | 12/2014 | He et al. |
| 2015/0050535 A1 | 2/2015 | Amiruddin et al. |
| 2015/0217538 A1 | 8/2015 | Zhamu et al. |
| 2015/0218003 A1 | 8/2015 | Zhamu et al. |
| 2015/0266739 A1 | 9/2015 | Zhamu et al. |

OTHER PUBLICATIONS

U.S. Appl. No. 11/509,424, filed Aug. 25, 2006, B. Z. Jang, et al.
Lee et al., "Tin dioxide nanoparticles impregnated in graphite oxide for improvedlithium storage and cyclability in secondary ion batteries", Electrochimica Acta 113 (2013) 149-155.
Kim et al., "Room-temperature metastability of multilayer graphene oxide films", Nature materials, 11(6), 544-549.
Chen et al., "Three-dimensional Flexible and Conductive Interconnected Graphene Networks Grown by Chemical Vapor Deposition" Nature Materials (2011) vol. 10, pp. 424-428.
PCT/US16/38528 International Search Report dated Dec. 8, 2016.
Whitacre et al., "Na4Mn9O18 as a positive electrode material for an aqueous electrolyte sodium-ion energy storage device" Electrochemistry Communications (2010) vol. 12, pp. 463-466.
Zhuo et al., "The preparation of NaV1-xCrxPO4F cathode materials for sodium-ion battery" Journal of Power Sources (2006) vol. 160, p. 698-703.

* cited by examiner

20 μm (75 μm wide)

Deviation angle > 45°

PRODUCTION PROCESS FOR HIGHLY CONDUCTING AND ORIENTED GRAPHENE FILM

FIELD OF THE INVENTION

The present invention relates generally to the field of graphene materials and, more particularly, to a highly conductive film composed of conducting binder material-bonded graphene sheets or molecules that are highly oriented along film plane directions. This new graphene oxide-derived hybrid film exhibits an unprecedented combination of exceptionally high degree of graphene sheet orientation, high thermal conductivity, high electrical conductivity, high tensile strength, and high elastic modulus.

BACKGROUND OF THE INVENTION

Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nano-tubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Bulk natural graphite is a 3-D graphitic material with each graphite particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are inclined at different orientations. In other words, the orientations of the various grains in a graphite particle typically differ from one grain to another.

A graphite single crystal (crystallite) per se is anisotropic with a property measured along a direction in the basal plane (crystallographic a- or b-axis direction) being dramatically different than if measured along the crystallographic c-axis direction (thickness direction). For instance, the thermal conductivity of a graphite single crystal can be up to approximately 1,920 W/mK (theoretical) or 1,800 W/mK (experimental) in the basal plane (crystallographic a- and b-axis directions), but that along the crystallographic c-axis direction is less than 10 W/mK (typically less than 5 W/mK). Further, the multiple grains or crystallites in a graphite particle are typically all oriented along different and random directions. Consequently, a natural graphite particle composed of multiple grains of different orientations exhibits an average property between these two extremes (i.e. between 5 W/mK and 1,800 W/mK).

It would be highly desirable in many applications to produce a graphitic film (thin or thick) containing single or multiple graphene grains, having sufficiently large dimensions (i.e. large length and width) and having all graphene planes being essentially parallel to one another along one desired direction. In other words, it is highly desirable to have one large-size graphitic film (e.g. a fully integrated layer of multiple graphene planes) having the c-axis directions of all the graphene planes being substantially parallel to one another and having a sufficiently large film length and/or width for a particular application. It has not been possible to produce such a highly oriented graphitic film. Even though some attempts have been made to produce the so-called highly oriented pyrolytic graphite (HOPG) through tedious, energy intensive, and expensive chemical vapor deposition (CVD) followed by ultra-high temperature graphitization, the graphitic structure of the HOPG remains inadequately aligned and laden with defects and, hence, exhibits properties that are significantly lower than what are theoretically predicted.

The constituent graphene planes of a graphite crystallite in a natural or artificial graphite particle can be exfoliated and extracted or isolated to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of approximately 0.3354 nm is commonly referred to as a multi-layer graphene. A multi-layer graphene platelet has up to 300 layers of graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene sheets are collectively called "nano graphene platelets" (NGPs). Graphene or graphene oxide sheets/platelets (collectively, NGPs) are a new class of carbon nano material (a 2-D nano carbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted on Oct. 21, 2002; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

NGPs are typically obtained by intercalating natural graphite particles with a strong acid and/or oxidizing agent to obtain a graphite intercalation compound (GIC) or graphite oxide (GO), as illustrated in FIG. 5(A) (process flow chart) and FIG. 5(B) (schematic drawing). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the c-axis direction. The GIC or GO is most often produced by immersing natural graphite powder (20 in FIG. 5(A) and 100 in FIG. 5(B)) in a mixture of sulfuric acid, nitric acid (an oxidizing agent), and another oxidizing agent (e.g. potassium permanganate or sodium perchlorate). The resulting GIC (22 or 102) is actually some type of graphite oxide (GO) particles. This GIC or GO is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid volume expansion by a factor of 30-300 to form "graphite worms" (24 or 104), which are each a collection of exfoliated, but largely unseparated graphite flakes that remain interconnected. A SEM image of graphite worms is presented in FIG. 6(A).

In Route 1A, these graphite worms (exfoliated graphite or "networks of interconnected/non-separated graphite flakes") can be re-compressed to obtain flexible graphite sheets or foils (26 or 106) that typically have a thickness in the range of 0.1 mm (100 µm)-0.5 mm (500 µm). Alternatively, one may choose to use a low-intensity air mill or shearing machine to simply break up the graphite worms for the purpose of producing the so-called "expanded graphite flakes" (108) which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT or CNF) or the 2-D nano carbon material (graphene sheets or platelets, NGPs). Flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm. These low conductivity values are a direct result of the many defects, wrinkled or folded graphite flakes, interruptions or gaps between graphite flakes, and non-parallel flakes (e.g. SEM image in FIG. 6(B), wherein many flakes are inclined at an angle deviating from the desired orientation direction by >30°). Many flakes are inclined with respect to one another at a very large angle (e.g. mis-orientation of 20-40 degrees). The average deviation angle is greater than 10°, more typically >20°, and often >30°.

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm, but more typically less than 20 nm.

Route 2 entails ultrasonicating the graphite oxide suspension for the purpose of separating/isolating individual graphene oxide sheets from graphite oxide particles. This is based on the notion that the inter-graphene plane separation has been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.001%-10% by weight, more typically 0.01%-5% by weight, most typically and preferably less than 2% by weight.

For the purpose of defining the claims of the instant application, NGPs include discrete sheets/platelets of single-layer and multi-layer pristine graphene, graphene oxide, or reduced graphene oxide (RGO). Pristine graphene has essentially 0% oxygen. RGO typically has an oxygen content of 0.001%-5% by weight. Graphene oxide (including RGO) can have 0.001%-50% by weight of oxygen.

It may be noted that flexible graphite foils (obtained by compressing or roll-pressing exfoliated graphite worms) for electronic device thermal management applications (e.g. as a heat sink material) have the following major deficiencies: (1) As indicated earlier, flexible graphite (FG) foils exhibit a relatively low thermal conductivity, typically <500 W/mK and more typically <300 W/mK. By impregnating the exfoliated graphite with a resin, the resulting composite exhibits an even lower thermal conductivity (typically <<200 W/mK, more typically <100 W/mK). (2) Flexible graphite foils, without a resin impregnated therein or coated thereon, are of low strength, low rigidity, and poor structural integrity. The high tendency for flexible graphite foils to get torn apart makes them difficult to handle in the process of making a heat sink. As a matter of fact, the flexible graphite sheets (typically 50-200 µm thick) are so "flexible" that they are not sufficiently rigid to make a fin component material for a finned heat sink. (3) Another very subtle, largely ignored or overlooked, but critically important feature of FG foils is their high tendency to get flaky with graphite flakes easily coming off from FG sheet surfaces and emitting out to other parts of a microelectronic device. These highly electrically conducting flakes (typically 1-200 µm in lateral dimensions and >100 nm in thickness) can cause internal shorting and failure of electronic devices.

Similarly, solid NGPs (including discrete sheets/platelets of pristine graphene, GO, and RGO), when packed into a film, membrane, or paper sheet (34 or 114 in FIG. 5(A) or 5(B)) of non-woven aggregates using a paper-making process, typically do not exhibit a high thermal conductivity unless these sheets/platelets are closely packed and the film/membrane/paper is ultra-thin (e.g. <1 µm, which is mechanically weak). This is reported in our earlier U.S. patent application Ser. No. 11/784,606 (Apr. 9, 2007). However, ultra-thin film or paper sheets (<10 µm) are difficult to produce in mass quantities, and difficult to handle when one tries to incorporate these thin films as a heat sink material. In general, a paper-like structure or mat made from platelets of graphene, GO, or RGO (e.g. those paper sheets prepared by vacuum-assisted filtration process) exhibit many defects, wrinkled or folded graphene sheets, interruptions or gaps between platelets, and non-parallel platelets (e.g. SEM image in FIG. 7(B)), leading to relatively poor thermal conductivity, low electric conductivity, and low structural strength. These papers or aggregates of discrete NGP, GO or RGO platelets alone (without a resin binder) also have a tendency to get flaky, emitting conductive particles into air.

Another prior art graphitic material is the pyrolytic graphite film, typically thinner than 100 µm. The lower portion of FIG. 5(A) illustrates a typical process for producing prior art pyrolytic graphitic films from a polymer. The process begins with carbonizing a polymer film 46 (e.g. polyimide) at a carbonization temperature of 400-1,000° C. under a typical pressure of 10-15 Kg/cm$^2$ for 2-10 hours to obtain a carbonized material 48, which is followed by a graphitization treatment at 2,500-3,200° C. under an ultrahigh pressure of 100-300 Kg/cm$^2$ for 1-24 hours to form a graphitic film 50.

It is technically utmost challenging to maintain such an ultrahigh pressure at such an ultrahigh temperature. This is a difficult, slow, tedious, energy-intensive, and extremely expensive process. Furthermore, it has been difficult to produce pyrolytic graphite film thinner than 15 µm or thicker than 50 µm from a polymer such as polyimide. This thickness-related problem is inherent to this class of materials due to their difficulty in forming into an ultra-thin (<10 µm) and thick film (>50 µm) while still maintaining an acceptable degree of polymer chain orientation and mechanical strength that are required of proper carbonization and graphitization. The carbonization and graphitization yield rates of these thin or thick films from PI are also known to be excessively low (typically <85% and often down to 50%).

A second type of pyrolytic graphite is produced by high temperature decomposition of hydrocarbon gases in vacuum followed by deposition of the carbon atoms to a substrate surface. This vapor phase condensation of cracked hydrocarbons is essentially a chemical vapor deposition (CVD) process. In particular, highly oriented pyrolytic graphite (HOPG) is the material produced by subjecting the CVD-deposited pyro-carbon to a uniaxial pressure at very high temperatures (typically 3,000-3,300° C.). This entails a thermo-mechanical treatment of combined and concurrent mechanical compression and ultra-high temperature for an extended period of time in a protective atmosphere; a very expensive, energy-intensive, time-consuming, and technically challenging process. The process requires ultra-high temperature equipment (with high vacuum, high pressure, or high compression provision) that is not only very expensive to make but also very expensive and difficult to maintain. Even with such extreme processing conditions, the resulting HOPG still possesses many defects, grain boundaries, and mis-orientations (neighboring graphene planes not parallel to each other), resulting in less-than-satisfactory in-plane properties. Typically, the best prepared HOPG sheet or block typically contains many poorly aligned grains or crystals and a vast amount of grain boundaries and defects.

Similarly, the most recently reported graphene thin film (<2 nm) prepared by catalytic CVD of hydrocarbon gas (e.g. $C_2H_4$) on Ni or Cu surface is not a single-grain crystal, but a poly-crystalline structure with many grain boundaries and defects. With Ni or Cu being the catalyst, carbon atoms obtained via decomposition of hydrocarbon gas molecules at 800-1,000° C. are deposited onto Ni or Cu foil surface to form a sheet of single-layer or few-layer graphene that is poly-crystalline. The grains are typically much smaller than 100 µm in size and, more typically, smaller than 10 µm in size. These graphene thin films, being optically transparent and electrically conducting, are intended for applications such as the touch screen (to replace indium-tin oxide or ITO glass) or semiconductor (to replace silicon, Si). Furthermore, the Ni- or Cu-catalyzed CVD process does not lend itself to the deposition of more than 5 graphene planes (typically <2 nm) beyond which the underlying Ni or Cu catalyst can no longer provide any catalytic effect. There has been no experimental evidence to indicate that CVD graphene layer thicker than 5 nm is possible. Both CVD graphene film and HOPG are extremely expensive.

Thus, it is an object of the present invention to provide a cost-effective process for producing graphene oxide (GO)-derived highly oriented graphitic film, which exhibits a thermal conductivity, electrical conductivity, elastic modulus, and/or tensile strength that is comparable to or greater than those of the HOPG, CVD graphene film, and/or flexible graphite. This process is capable of producing a highly oriented graphene oxide film and resulting graphitic film of practically any desired film thickness. This graphitic film is composed of highly aligned graphene planes that are self-merged or bonded edge-to-edge by a conductive binder material.

It is another object of the present invention to provide a process for producing GO-derived highly oriented graphene film thicker than 0.1 µm (preferably thicker than 1 µm) but thinner than 500 µm (preferably thinner than 200 µm, more preferably thinner than 100 µm, and most preferably from 5 to 50 µm) for use as a heat dissipation element in a smart phone, tablet computer, digital camera, display device, flat-panel TV, LED lighting device, etc. Such a thin film exhibits a combination of exceptional thermal conductivity, electrical conductivity, mechanical strength, and elastic modulus unmatched by any material of comparable thickness range. The highly oriented graphene film can exhibit an electrical conductivity greater than 15,000 S/cm, a thermal conductivity greater than 1,750 W/mK, a physical density greater than 2.1 g/cm$^3$, a tensile strength greater than 120 MPa, and/or an elastic modulus greater than 120 GPa. No other material is known to exhibit this set of outstanding properties.

The present invention is directed at a new materials science approach to designing and producing a new class of materials herein referred to as the highly oriented graphitic film. The preparation of such a highly oriented graphitic film begins with the production of a thin-film structure composed of highly aligned graphene oxide sheets or molecules, wherein all of the graphene oxide planes are essentially parallel to one another. The oxygen content of this oriented GO structure is typically from 5% to 50% by weight. When this oriented GO structure is heat-treated, the oxygen content is reduced and the evolution of the oxygen-containing species sometimes can leave behind some gaps in the structure (even if this heat treatment step is followed by a compression step). The present invention bridges these gaps or interruptions in graphene planes with a conductive binder material, enabling barrier-free transport of electrons and phonons between graphene planes or domains. In most cases, the graphitic film has an oxygen amount of 0.01-5% by weight. In contrast, the conventional HOPG contains no oxygen, but many defects or interruptions.

SUMMARY OF THE INVENTION

The present invention provides a highly conductive hybrid graphene-conductor material film that is composed of highly oriented graphene sheets (aligned along film plane directions) that are bonded by a conductive material binder, preferably and typically at the graphene sheet edges. The thickness of this film can be from 5 nm to 500 µm (can be even thicker; e.g. up to 5 mm), but more typically from 10 nm to 200 µm, and further more typically from 100 nm to 100 µm. The present invention also provides a process for producing such a conductive hybrid graphitic film.

In some embodiments, the process comprises: (a) preparing either a graphene dispersion having graphene sheets (pristine graphene, GO, and/or RGO) dispersed in a fluid medium or a graphene oxide gel having graphene oxide molecules dissolved in a fluid medium, wherein the graphene oxide sheets or graphene oxide molecules contain an oxygen content higher than 5% by weight; (b) dispensing and depositing the graphene dispersion or graphene oxide gel onto a surface of a supporting solid substrate under a shear stress to form a wet layer of graphene or graphene oxide, having oriented graphene sheets or graphene oxide molecules, on this supporting substrate; (c) at least partially removing the fluid medium from the wet layer of graphene sheets or graphene oxide molecules to form a dried layer of graphene or graphene oxide having an inter-planar spacing $d_{002}$ of 0.4 nm to 1.2 nm as determined by X-ray diffraction and an oxygen content higher than 5% by weight; (d) heat treating the dried layer of graphene or graphene oxide at a heat treatment temperature from 55° C. to 3,200° C. for a desired length of time to produce a porous graphitic film having pores and constituent graphene sheets or a 3D network of graphene pore walls having an inter-planar spacing $d_{002}$ less than 0.4 nm and an oxygen content less than 5% by weight; and (e) impregnating the porous graphitic film with a conductive material binder (herein referred to as the conductor material) that bonds the constituent graphene sheets or graphene pore walls to form the desired conducting film having a continuous network of electron-conducting and phonon-conducting pathways. Preferably, the process further comprises a step (f) of mechanically compressing or consolidating the conducting film.

The graphene sheets or GO molecules in the dried layer of graphene or graphene oxide are aligned substantially parallel to one another along film plane directions and the average deviation angle of these sheets or molecules from the film plane is less than 10 degrees. It may be noted that, in conventional GO or RGO sheet-based paper, graphene sheets or platelets are inclined with respect to one another (or relative to the film plane) at a very large angle (e.g. mis-orientation of 20-40 degrees). The average deviation angle from the desired orientation angle is greater than 10°, more typically >20°, and often >30°.

The subsequent heat treatment can lead to the formation of voids and gaps between graphene sheets/molecules, possibly due to the evolution of heat-induced oxygen-containing species (e.g. $CO_2$ and $H_2O$). Upon further study, we have come to realize that the gaps and voids can survive the subsequent compression procedure, leaving behind interruptions that impede transport of electrons and phonons. Thus, we impregnate the resulting porous film with select conductive materials to bridge the gaps, significantly reducing the resistance to electron and phonon flow. The conductive material binder bonds the constituent graphene sheets in the graphitic layer at least in an end-to-end manner and/or the conductor material fills into pores of the porous graphitic film. The conductor material is selected from a metal, an intrinsically conductive polymer, a conductive organic compound, or a combination thereof.

An electrically conducting polymer is composed of macromolecules having fully conjugated sequences of double bonds along the chains. Examples of intrinsically conducting polymers are poly(fluorene), polyphenylene, polypyrene, polyazulene, polynaphthalene, poly(pyrrole) (PPY), polycarbazole, polyindole, polyazepine, polyaniline (PANI), poly(thiophene) (PT), poly(3,4-ethylenedioxythiophene) (PEDOT), poly(p-phenylene sulfide) (PPS), Poly(acetylene)s (PAC), and poly(p-phenylene vinylene) (PPV). Preferred intrinsically conducting polymers are poly(3,4-ethylenedioxythiophene) (PEDOT), polythiophene, polypyrrole, and polyaniline. Unlike polymeric electrolytes, in which charge is transported by dissolved ions, charge in intrinsically conducting polymers is transported along and between polymer molecules via generated charge carriers (e.g., holes, electrons).

In certain embodiments, the conductor material contains a conductive organic compound selected from coal tar pitch, a derivative of coal tar pitch, petroleum pitch, a derivative of petroleum tar pitch, isotropic pitch, mesophase pitch, a polycyclic aromatic compound, pentacene, anthracene, rubrene, or a combination thereof.

In some embodiments, the dispensing and depositing step includes an operation of spraying, casting, printing, coating, or a combination thereof. This operation must include a provision of inducing shear stresses that align the graphene sheets or GO molecules along the surface plane of the supporting solid substrate. This shear stress-induced orientation is essential to achieving high in-plane electrical and thermal conductivity values of the resulting graphene-metal film.

The coating operation can include spin coating, dip coating, immersion dip coating, air knife coating, Anilox coating, Flexo coating, gap coating or knife-over-roll coating, gravure coating, metering-rod coating, kissing coating, slot-die coating, slot-die bead coating, slide coating (bead coating with an angled slide between the slot die and the bead), tensioned-web slot die coating (with no backing for the web), roller coating (forward roller coating or reverse roll coating), silk screen coating, rotary screen coating, extrusion coating, curtain coating, or a combination thereof. The preferred coating operations include slot-die coating, comma coating, and reverse roll transfer coating. In some embodiments, the casting operation is selected from spin casting, spray casting, or combined casting-coating. The coating or casting operation must entail shear stresses to align graphene oxide sheets or molecules.

The heat treatment temperature is preferably from 80 to 2,950° C., more preferably from 300 to 2,950° C., and further more preferably from 500 to 2,500° C. It may be noted that graphitization of carbonized materials typically would not occur at a temperature lower than 2,500° C. and, hence, heat treatment temperatures lower than 2,500° C. normally lead to significantly lower thermal and electrical conductivity (e.g. due to less perfect graphite crystals, poor graphite crystal alignment, etc.). However, the present process allows for a heat treatment temperature much lower than 2,500° C. (e.g. lower than 1,500° C. or even lower than 1,000° C.) and yet still enables the resulting graphene-metal film to exhibit exceptionally high thermal conductivity and electric conductivity. Thus, in some embodiments, the heat treatment temperatures are from 80 to 1,500° C. or from 100 to 1,000° C.

The step of impregnating the porous graphitic film with a metal may include an operation of electrochemical deposition or plating, pulse power deposition, electrophoretic deposition, electroless plating or deposition, metal melt impregnation, metal precursor impregnation, chemical deposition, physical vapor deposition, physical vapor infiltration, chemical vapor deposition, chemical vapor infiltration, sputtering, or a combination thereof. In some embodiments, the step of impregnating the porous graphitic film with a metal and the step of heat treating the dried graphene oxide layer are conducted concurrently.

The desired binder metal is preferably selected from Ti, V, Cr, Mn, Fe, Co, Ni, Cu, Zn, Zr, Mo, Pd, Ag, Cd, Au, Pt, W, Al, Sn, In, Pb, Bi, an alloy thereof, or a mixture thereof. More preferably, the metal is selected from Cu, Al, Ti, Sn, Ag, Au, Fe, or an alloy thereof. Typically, the metal occupies a weight fraction of 0.1%-50% based on the total conducting film weight. Preferably, the metal occupies a weight fraction of 1%-10% based on the total conducting film weight.

Preferably, the process further comprises a step of aging the wet or dried layer of graphene oxide in an aging room at an aging temperature from 25° C. to 100° C. and a humidity level from 20% to 99% for an aging time of 1 hour to 7 days to form an aged layer of graphene oxide prior to the step (d) of heat treating.

In some embodiments, the step (d) of heat treating is conducted for a length of time sufficient for decreasing an inter-plane spacing $d_{002}$ to a value of from 0.3354 nm to 0.36 nm and decreasing the oxygen content to less than 2% by weight in the graphitic film.

In a preferred embodiment, the fluid medium consists of water and/or an alcohol. In a preferred embodiment, the conducting film has a thickness from 10 nm to 500 μm, preferably from 100 nm to 100.

In a preferred embodiment, the graphene sheets or GO molecules in the graphene dispersion or GO gel occupy a weight fraction of 0.1% to 25% based on the total weight of graphene sheets or graphene oxide molecules and liquid medium combined. Preferably, the graphene sheets or GO molecules in said graphene dispersion or GO gel occupy a weight fraction of 0.5% to 15% based on the total weight of graphene sheets or GO molecules and liquid medium combined. In a preferred embodiment, the graphene sheets or molecules in the graphene dispersion or GO gel occupy a weight fraction of 3% to 15% based on the total weight of graphene oxide sheets and liquid medium combined. Preferably, the graphene dispersion or graphene oxide gel has greater than 3% by weight of graphene or GO oxide dispersed in the fluid medium to form a liquid crystal phase.

In some preferred embodiments, the graphene oxide dispersion or graphene oxide gel is prepared by immersing a graphitic material in a powder or fibrous form in an oxidizing liquid in a reaction vessel at a reaction temperature for a length of time sufficient to obtain said graphene oxide dispersion or said graphene oxide gel wherein said graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

In a preferred embodiment, the heat treatment temperature contains a temperature in the range of 500° C.-1,500° C. and the graphitic film has an oxygen content less than 1%, an inter-graphene spacing less than 0.345 nm, a thermal conductivity of at least 1,000 W/mK, and/or an electrical conductivity no less than 3,000 S/cm.

In another preferred embodiment, the heat treatment temperature contains a temperature in the range of 1,500° C.-2,200° C. and the graphitic film has an oxygen content less than 0.01%, an inter-graphene spacing less than 0.337 nm, a thermal conductivity of at least 1,300 W/mK, and/or an electrical conductivity no less than 5,000 S/cm.

In yet another preferred embodiment, the heat treatment temperature contains a temperature greater than 2,500° C. and the graphitic film has an oxygen content no greater than 0.001%, an inter-graphene spacing less than 0.336 nm, a mosaic spread value no greater than 0.7, a thermal conductivity of at least 1,500 W/mK, and/or an electrical conductivity no less than 10,000 S/cm.

In a preferred embodiment, the graphitic film exhibits an inter-graphene spacing less than 0.337 nm and a mosaic spread value less than 1.0. Preferably, the graphitic film exhibits a degree of graphitization no less than 80% and/or a mosaic spread value less than 0.4. More preferably, the graphitic film exhibits a degree of graphitization no less than 90% and/or a mosaic spread value no greater than 0.4.

In a preferred embodiment, the graphene dispersion or graphene oxide gel is obtained from a graphitic material having a maximum original graphite grain size and said graphitic film is a poly-crystal graphene structure having a grain size larger than said maximum original grain size. In a preferred embodiment, the graphene dispersion or graphene oxide gel is obtained from a graphitic material having multiple graphite crystallites exhibiting no preferred crystalline orientation as determined by an X-ray diffraction or electron diffraction method and wherein said graphitic film is a single crystal or a poly-crystal graphene structure having a preferred crystalline orientation as determined by said X-ray diffraction or electron diffraction method. Typically, the step of heat-treating induces chemical linking, merging, or chemical bonding of graphene oxide sheets or graphene oxide molecules in an edge-to-edge manner.

This new class of materials (i.e., a film of highly oriented graphene sheets bonded by a conductor binder) has the following characteristics that distinguish themselves from highly oriented pyrolytic graphite (HOPG), flexible graphite sheets, and paper/film/membrane sheets of discrete graphene/GO/RGO sheets/platelets:

(1) This film is a poly-crystal composed of highly oriented multiple graphene sheets or grains with exceptionally large grain sizes; these graphene sheets or grains are bonded by a metal that provides continuity for electron and phonon transport. The film has all the graphene planes in all the grains being essentially oriented parallel to one another (i.e., the crystallographic c-axis of all grains essentially pointing in an identical direction).

(2) With a proper coating or casting process (e.g. including a reverse roll transfer coating procedure), such a high degree of orientation can be achieved even with thick films, not just thin films Given the same thickness, the reverse roll procedure enables the high degree of orientation and high degree of crystal perfection at a significantly lower heat treatment temperature. Furthermore, the use of a conductive binder enables the high electrical and thermal conductivity being achieved even at a low heat treatment temperature (e.g. lower than 1,500° C. or even lower than 1,000° C.).

(3) The film is an integrated graphene entity that is not a simple aggregate or stack of multiple discrete graphite flakes or discrete platelets of graphene/GO/RGO, and does not contain any discernible or discrete flake/platelet derived from the original GO sheets. These originally discrete flakes or platelets have been chemically bonded or linked together to form larger grains (grain size being larger than the original platelet/flake size).

(4) Under select heat treatment conditions, well-aligned GO sheets or GO molecules are capable of chemically merging with one another mainly in an edge-to-edge manner to form giant 2-D graphene grains, but possibly also with adjacent GO sheets below or above to form 3-D networks of graphene chains. Through joining or forming of covalent bonds with one another, the GO sheets are adhered into an integrated graphene entity. Where gaps or non joining graphene sheet edges are present, an externally added conductive binder is used to fill these gaps or remove the interruption of electron-transporting paths.

(5) These constituent graphene planes have an identical crystallographic c-axis (essentially all parallel to one another). These planes are derived from GO, which is in turn obtained from moderate or heavy oxidation of natural graphite or artificial graphite particles each originally having multiple graphite crystallites that are randomly oriented. Prior to being chemically oxidized to become GO dispersion (moderate-to-heavy oxidation of graphite) or GO gel (heavy oxidation for a sufficiently long oxidation time to achieve fully separated GO molecules dissolved in water or other polar liquid), these starting or original graphite crystallites have an initial length ($L_a$ in the crystallographic a-axis direction), initial width ($L_b$ in the b-axis direction), and thickness ($L_c$ in the c-axis direction). The resulting graphitic film typically has a length or width significantly greater than the $L_a$ and $L_b$ of the original graphite crystallites.

(6) This process involves significantly lower heat treatment temperatures and lower pressure as compared with the processes for producing HOPG from either carbonized polymers (e.g. polyimide) or the CVD graphite. The presently invented process is simpler (hence, more reliable), faster, less energy-intensive, and highly scalable.

(7) This process for producing a graphitic film of highly oriented graphene sheets bonded by a conductive binder can be conducted on a continuous roll-to-roll basis and, hence, is much more cost-effective. No other process is known to be capable of producing highly oriented graphitic structures on a continuous basis.

BRIEF DESCRIPTION OF THE DRAWINGS

FIG. 13 (B) Tensile strength of the GO-derived graphitic films, their Zn-impregnated counterparts (5% by wt. Zn), RGO platelet paper, and 5% Zn-impregnated RGO paper.

DESCRIPTION OF THE PREFERRED EMBODIMENTS

Figure 1:
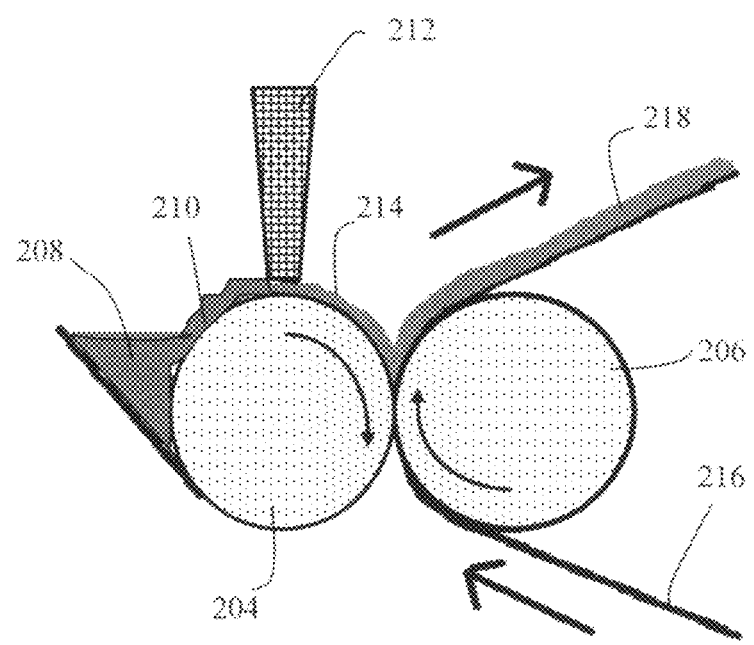
FIG. 1 Schematic of a reverse roll-based GO layer transfer apparatus for producing highly oriented GO films.

The present invention provides a process for producing a highly conducting hybrid graphene-conductor film obtained by heat-treating a highly oriented graphene oxide film to form a porous graphitic film, which is judiciously impregnated with a conductive binder material, herein referred to as a conductor material. Preferably, the process comprises:
(a) preparing either a graphene oxide dispersion having graphene oxide sheets dispersed in a fluid medium or a graphene oxide gel having graphene oxide molecules dissolved in a fluid medium, wherein the graphene oxide sheets or graphene oxide molecules contain an oxygen content higher than 5% by weight (typically higher than 20% by weight, but up to 50%);
(b) dispensing and depositing the graphene oxide dispersion or graphene oxide gel onto a surface of a supporting solid substrate under a shear stress to form a wet layer of graphene oxide, having oriented graphene oxide sheets or molecules, on this supporting substrate; (The GO sheets or GO molecules are highly aligned along the layer plane directions mainly due to the shear stress.)
(c) at least partially removing the fluid medium from the wet layer of graphene oxide to form a dried layer of graphene oxide having an inter-planar spacing $d_{002}$ of 0.4 nm to 1.2 nm as determined by X-ray diffraction and an oxygen content higher than 5% by weight;
(d) heat treating the dried layer of graphene oxide at a heat treatment temperature from 55° C. to 3,200° C. (more preferably from 100° C. to 2,500° C., further preferably from 300° C. to 1,500° C., and most preferably from 500° C. to 1,000° C.) for a desired length of time to produce a porous graphitic film having pores and constituent graphene sheets or a 3D network of graphene pore walls having an inter-planar spacing $d_{002}$ less than 0.4 nm and an oxygen content less than 5% by weight; and
(e) impregnating the porous graphitic film with a conductor material that bonds the constituent graphene sheets or graphene pore walls to form the desired conducting film having a continuous network of electron-conducting and phonon-conducting pathways. Preferably, the process further comprises a step (f) of mechanically compressing or consolidating the impregnated graphitic film to produce the highly conducting film.

It may be noted that step (d) of heat treating the GO layer produces two major effects. One effect is the notion that the heat treatment serves to thermally reduce the graphene oxide by removing oxygen-containing groups to possibly produce pores due to the evolution of some chemical groups (e.g. $CO_2$, $H_2O$, etc.). The other effect is that many (but not all) graphene oxide sheets or molecules can get chemically linked together in an edge-to-edge and/or inter-molecular manner, leading to longer or wider graphene sheets or molecules (larger graphene crystal domains or grains). However, there are gaps present between those graphene edges that are not chemically linked with their neighbors. These gaps and other pores are impediments to transport of electrons and phonons (quantized lattice vibrations). From solid-state physics perspectives, the electrical conductivity depends upon electron transport and the thermal conductivity is dictated by the transport of both electrons and phonons. By introducing a conducting binder material (conductor material) to bond together adjacent graphene sheets or fill in the gaps between highly oriented graphene sheets we have surprisingly observed some unexpected, synergistic effects (both the electrical conductivity and thermal conductivity are higher than what would be predicted based on the rule-of-mixture laws commonly used in the field of composite materials).

In step (a), the fluid medium in the graphene oxide dispersion or gel prepared may consist of water and/or an alcohol. In the invented process, the graphene oxide sheets in the graphene oxide dispersion preferably occupy a weight fraction of 0.1% to 25% based on the total weight of graphene oxide sheets and liquid medium combined. More preferably, the graphene oxide sheets in the graphene oxide dispersion occupy a weight fraction of 0.5% to 15%. In some embodiments, graphene oxide sheets occupy a weight proportion from 3% to 15% based on the total weight of graphene oxide sheets and liquid medium combined. In certain embodiments, the graphene oxide dispersion or graphene oxide gel has greater than 3% by weight of graphene oxide dispersed in the fluid medium to form a liquid crystal phase. The preparation of GO dispersion or GO gel will be described in details later.

Step (b) of dispensing and depositing typically includes an operation of spraying, casting, printing, coating, or a combination thereof. For instance, the coating operation includes spin coating, dip coating, immersion dip coating, air knife coating, Anilox coating, Flexo coating, gap coating or knife-over-roll coating, gravure coating, metering-rod coating, kissing coating, slot-die coating, slot-die bead coating, slide coating (bead coating with an angled slide between the slot die and the bead), tensioned-web slot die coating (with no backing for the web), roller coating (forward roller coating or reverse roll coating), silk screen coating, rotary screen coating, extrusion coating, curtain coating, or a combination thereof. Most preferred are knife-over-roll coating, metering-rod coating, comma coating, slot-die coating, and reverse-roll transfer coating.

An example of reverse-roll transfer coating is schematically illustrated in FIG. 1. With this coating apparatus, the process of producing highly oriented graphene oxide film (HOGOF) begins with preparation of a graphene oxide dispersion (GO dispersion) or graphene oxide gel (GO gel) that is delivered to a trough 208. The rotational motion of an application roller 204 in a first direction enables the delivery of a continuous layer 210 of GO dispersion or gel onto the exterior surface of the application roller 204. An optional doctor's blade 212 is used to regulate the thickness (amount) of an applicator layer 214 of graphene oxide (GO). This applicator layer is continuously delivered to the surface of a supporting film 216 moving in a second direction (e.g. driven by a counter-rotating roller 206, rotating in a direction opposite to the first direction) to form a wet layer 218 of graphene oxide. This wet layer of GO is then subjected to a liquid removal treatment (e.g. under a heating environment and/or being vacuum-pumped).

In summary, step (b) includes dispensing the graphene oxide dispersion or graphene oxide gel onto a surface of an application roller rotating in a first direction at a first line velocity (the line speed at the external surface of the application roller) to form an applicator layer of graphene oxide and transferring this applicator layer of graphene oxide to a surface of a supporting film driven in a second direction opposite to the first direction at a second line velocity, forming a wet layer of graphene oxide on the supporting film.

In a preferred embodiment, the supporting film is driven by a counter-rotating supporting roller (e.g. 206 in FIG. 1) disposed at a working distance from the application roller and rotating in the second direction opposite to the first direction. The speed at the external surface of this supporting roller dictates the second line velocity (of the supporting film). Preferably, the supporting film is fed from a feeder roller and the dried layer of graphene oxide supported by the supporting film is wound on a winding roller and the process is conducted in a roll-to-roll manner.

Figure 2:
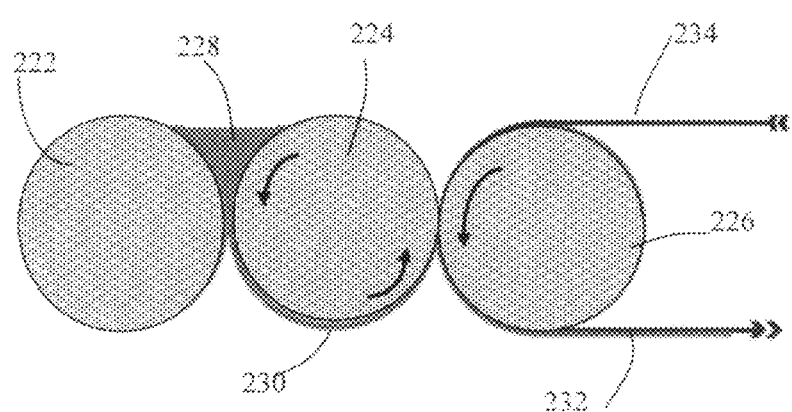
FIG. 2 Schematic of another reverse roll-based GO layer transfer apparatus for producing highly oriented GO films.
Figure 3:
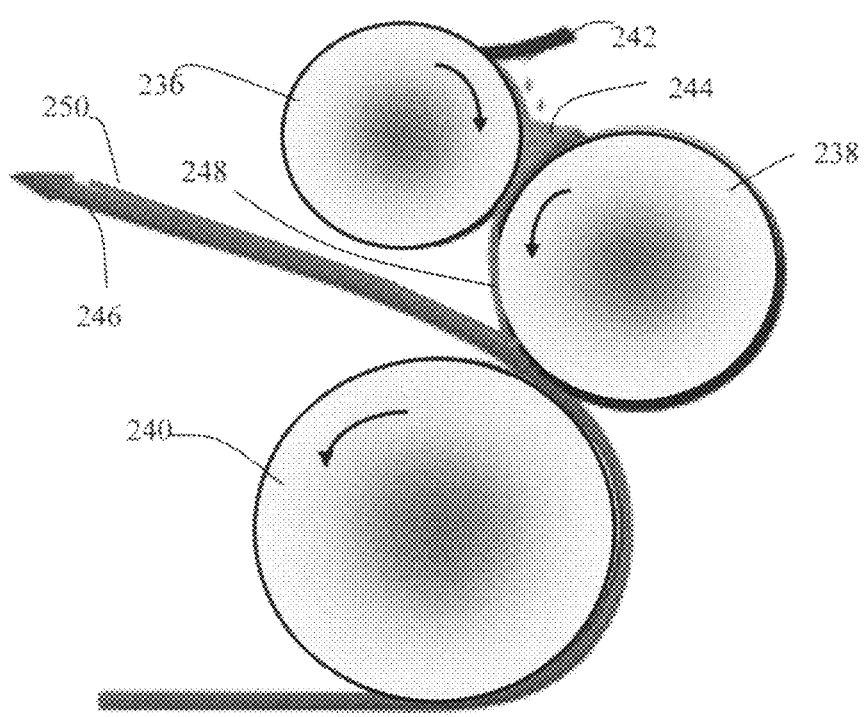
FIG. 3 Schematic of yet another reverse roll-based GO layer transfer apparatus for producing highly oriented GO films.
Figure 4:
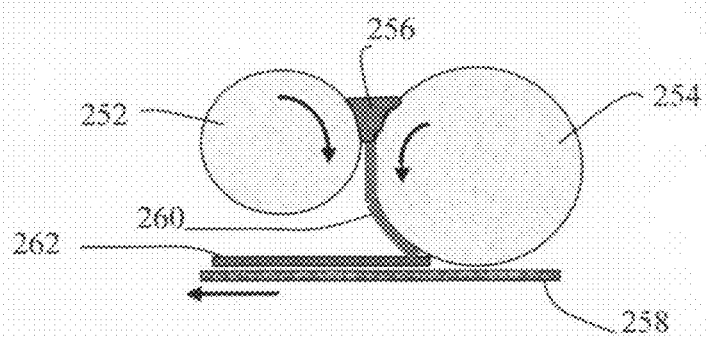
FIG. 4 Schematic of still another reverse roll-based GO layer transfer apparatus for producing highly oriented GO films.

This reverse roll transfer coating-based process is further illustrated in FIGS. 2, 3, and 4. In a preferred embodiment, as illustrated in FIG. 2, the GO dispersion/gel trough 228 is naturally formed between an application roller 224 and a metering roller 222 (also referred to as a doctor's roller). The relative motion or rotation of the application roller 224, relative to the metering roller 222, at a desired speed generates an applicator layer 230 of GO on the exterior surface of the application roller 224. This applicator layer of GO is then transferred to form a wet layer 232 of GO on the surface of a supporting film 234 (driven by a supporting roller 226 counter-rotating in a direction opposite to the rotational direction of the applicator roller 224). The wet layer may then be subjected to a drying treatment.

In another preferred embodiment, as illustrated in FIG. 3, the GO dispersion/gel trough 244 is naturally formed between an application roller 238 and a metering roller 236. The relative motion or rotation of the application roller 238, relative to the metering roller 236, at a desired speed generates an applicator layer 248 of GO on the exterior surface of the application roller 238. A doctor's blade 242 may be used to scratch off any GO gel/dispersion carried on the exterior surface of the metering roller 236. This applicator layer 248 of GO is then transferred to form a wet layer 250 of GO on the surface of a supporting film 246 (driven by a supporting roller 240 counter-rotating in a direction opposite to the rotational direction of the applicator roller 238). The wet layer may then be subjected to a drying treatment.

In yet another preferred embodiment, as illustrated in FIG. 4, the GO dispersion/gel trough 256 is naturally formed between an application roller 254 and a metering roller 252. The relative motion or rotation of the application roller 254, relative to the metering roller 252, at a desired speed generates an applicator layer 260 of GO on the exterior surface of the application roller 254. This applicator layer 260 of GO is then transferred to form a wet layer 262 of GO on the surface of a supporting film 258, driven to move in a direction opposite to the tangential rotational direction of the applicator roller 254. This supporting film 258 may be fed from a feeder roller (not shown) and taken up (wound) on a winding roller (not shown), which may also be a driving roller. There would be at least 4 rollers in this example. There can be a heating zone after the wet layer of GO is formed to at least partially remove the liquid medium (e.g. water) from the wet layer to form a dried layer of GO.

In some embodiments, the step of dispensing the graphene oxide dispersion or graphene oxide gel onto the surface of the application roller includes using a metering roller and/or a doctor's blade to provide a desired thickness of the applicator layer of graphene oxide on the application roller surface. In general, the process includes operating 2, 3, or 4 rollers.

The velocity ratio in a reverse-roll transfer apparatus, defined as (the second line velocity)/(first line velocity), is preferably from 1/5 to 5/1. If the external surface of the application roller moves at the same speed as the linear movement speed of the supporting film, then the velocity ratio is 1/1 or unity. If, as an example, the external surface of the application roller moves at a speed three times as fast as the linear movement speed of the supporting film, then the velocity ratio is 3/1. As a consequence, the transferred wet layer of GO would be approximately 3-fold in thickness as compared to the applicator layer of GO. Quite unexpectedly, this enables the production of much thicker layer yet still maintaining a high degree of GO orientation in the wet layer, the dried layer, and the subsequently heat-treated graphitic film. This is a highly significant and desirable outcome since a high degree of GO sheet orientation could not be achieved with thick films (e.g. >50 μm in thickness) by using casting or other coating techniques such as comma coating and slot-die coating. In certain embodiments, the velocity ratio is greater than 1/1 and less than 5/1. Preferably, the velocity ratio is greater than 1/1 and equal to or less than 3/1. For thinner layers (e.g. <50 μm), knife-over-roll coating, metering-rod coating, comma coating, or slot-die coating can be readily used to deposit wet layers of GO.

Step (c) of drying can be conducted by slightly heating and/or ventilating the wet layer. In a roll-to-roll process, drying is typically accomplished by allowing the wet layer to move through several (typically 1-7) heating zones. Preferably, the process further comprises a step of aging the wet or dried layer of graphene oxide in an aging room at an aging temperature from 25° C. to 100° C. (preferably from 25° C. to 55° C.) and humidity level from 20% to 99% for an aging time of 1 hour to 7 days to form an aged layer of graphene oxide. We have surprisingly observed that this aging procedure enables some chemical linking or merging of GO sheets or molecules in an edge-to-edge manner, as manifested by the observation by microscopy that the average length/width of the GO sheets is significantly increased (by a factor of 2-3) after aging. This would make it possible to maintain the sheet orientation, accelerate subsequent edge-to-edge linking to huge grains or crystal domains, and facilitating graphitization of graphitic domains at a much lower temperature.

The process further comprises a step (d) of heat treating the dried or dried and aged layer of graphene oxide at a first heat treatment temperature from 55° C. to 3,200° C. for a desired length of time (typically 0.5 to 36 hours, but more typically 1-24 hours) to produce a porous graphitic film having an inter-planar spacing $d_{002}$ much less than 0.4 nm and an oxygen content much less than 5% by weight. The process can further comprise a compression step, during or after said step (d), to reduce the thickness of the porous graphitic film, before or after impregnation of a conductive binder material into pores of the porous graphitic film.

If the heat treatment temperature is higher than 2,500° C. for a sufficient length of time, the inter-plane spacing $d_{002}$ can be reduced to a value of from 0.3354 nm to 0.36 nm and the oxygen content decreased to less than 2% by weight. The process can further comprise a compression step to reduce the thickness of the graphitic film during or after heat-treating the graphitic film. The resulting graphitic film is normally porous and can be impregnated with a conductive binder material.

The graphitic film typically has a thickness from 5 nm to 5 mm, more typically from 10 nm to 1 mm, still more typically from 50 nm to 500 μm, even more typically from 100 nm to 200 µm, preferably less than 100 µm, and more preferably from 100 nm to 50 µm.

The graphitic film contains chemically bonded and merged graphene planes. These planar aromatic molecules or graphene planes (hexagonal structured carbon atoms having a small amount of oxygen-containing group) are parallel to one another. The lateral dimensions (length or width) of these planes are huge, typically several times or even orders of magnitude larger than the maximum crystallite dimension (or maximum constituent graphene plane dimension) of the starting graphite particles. The presently invented graphitic film is a "giant graphene crystal" or "giant planar graphene particle" having all constituent graphene planes being essentially parallel to one another. This is a unique and new class of material that has not been previously discovered, developed, or suggested to possibly exist.

The dried GO mass has a high birefringence coefficient between an in-plane direction and the normal-to-plane direction. The oriented graphene oxide layer is itself a very unique and novel class of material that surprisingly has great cohesion power (self-bonding, self-polymerizing, and self-crosslinking capability). These characteristics have not been taught or hinted in the prior art.

We now provide some details about how to prepare graphene dispersion and gel (step (a) of the invented process). The GO may be obtained by immersing powders or filaments of a starting graphitic material in an oxidizing liquid medium (e.g. a mixture of sulfuric acid, nitric acid, and potassium permanganate) in a reaction vessel. The starting graphitic material may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

When the starting graphite powders or filaments are mixed in the oxidizing liquid medium, the resulting slurry is a heterogeneous suspension and appears dark and opaque. When the oxidation of graphite proceeds at a reaction temperature for a sufficient length of time (4-120 hours at room temperature, 20-25° C.), the reacting mass can eventually become a suspension that appears slightly green and yellowish, but remain opaque. If the degree of oxidation is sufficiently high (e.g. having an oxygen content between 20% and 50% by weight, preferably between 30% and 50%) and all the original graphene planes are fully oxidized, exfoliated and separated to the extent that each oxidized graphene plane (now a graphene oxide sheet or molecule) is surrounded by the molecules of the liquid medium, one obtains a GO gel. The GO gel is optically translucent and is essentially a homogeneous solution, as opposed to a heterogeneous suspension.

This GO suspension or GO gel typically contains some excess amount of acids and can be advantageously subjected to some acid dilution treatment to increase the pH value (preferably >4.0). The GO suspension (dispersion) preferably contain at least 1% by weight of GO sheets dispersed in a liquid medium, more preferably at least 3% by weight, and most preferably at least 5% by weight. It is advantageous to have an amount of GO sheets sufficient for forming a liquid crystalline phase. We have surprisingly observed that GO sheets in a liquid crystal state have the highest tendency to get readily oriented under the influence of a shear stress created by a commonly used casting or coating process.

The highest or final heat treatment temperature (HTT) that the GO layer experiences in step (d) may be divided into four distinct HTT regimes:

Regime 1 (55 to 200° C.): In this temperature range (the post-aging and thermal reduction regime), a GO layer primarily undergoes thermally-induced reduction reactions, leading to a reduction of oxygen content from typically 20-50% (as dried) to approximately 5-6%. This treatment results in a reduction of inter-graphene spacing from approximately 0.6-1.2 nm (as dried) down to approximately 0.4 nm, and an increase in in-plane thermal conductivity of GO film (without subsequent impregnation by a conductor material) from approximately 100 W/mK to 450 W/mK, and from approximately 200 W/mK to 650 W/mK (with conductor material impregnation). Even with such a low temperature range, some edge-to-edge chemical linking occurs. The GO molecules remain well-aligned, but the inter-GO spacing remains relatively large (0.4 nm or larger). Many O-containing functional groups survive.

Regime 2 (200° C.-1,000° C.): In this active chemical linking regime, extensive chemical combination, polymerization, and cross-linking between adjacent GO sheets or GO molecules occur. The oxygen content is reduced to typically 0.7% (<<1%) after chemical linking, resulting in a reduction of inter-graphene spacing to approximately 0.345 nm. This implies that some initial graphitization has already begun at such a low temperature, in stark contrast to conventional graphitizable materials (such as carbonized polyimide film) that typically require a temperature as high as 2,500° C. to initiate graphitization. This is another distinct feature of the presently invented graphitic film and its production processes. These chemical linking reactions result in an increase in in-plane thermal conductivity of thermally reduced films to 800-1,200 W/mK, and/or in-plane electrical conductivity to 3,000-4,000 S/cm. Upon impregnation by 1.0-10% by weight of conductor material, the films typically exhibit a thermal conductivity of 900-1,400 W/mK, and/or in-plane electrical conductivity to 4,000-5,000 S/cm.

Regime 3 (1,000-2,500° C.): In this ordering and re-graphitization regime, extensive graphitization or graphene plane merging occurs, leading to significantly improved degree of structural ordering. As a result, the oxygen content is reduced to typically 0.01% and the inter-graphene spacing to approximately 0.337 nm (achieving degree of graphitization from 1% to approximately 80%, depending upon the actual HTT and length of time). The improved degree of ordering is also reflected by an increase in in-plane thermal conductivity to >1,200-1,500 W/mK, and/or in-plane electrical conductivity to 5,000-7,000 S/cm. Upon impregnation by 1.0-10% by weight of conductor material, the films typically exhibit a thermal conductivity of 1,350-1,600 W/mK, and/or in-plane electrical conductivity to 5,000-10,000 S/cm.

Regime 4 (2,500-3,200° C.): In this re-crystallization and perfection regime, extensive movement and elimination of grain boundaries and other defects occur, resulting in the formation of nearly perfect single crystals or polycrystalline graphene crystals with huge grains, which can be orders of magnitude larger than the original grain sizes of the starting graphite particles for the production of GO suspension. The oxygen content is essentially eliminated, typically 0.001% or less. The inter-graphene spacing is reduced to down to approximately 0.3354 nm (degree of graphitization from 80% to nearly 100%), corresponding to that of a perfect graphite single crystal. Quite interestingly, the graphene poly-crystal has all the graphene planes being closely packed and bonded, and all the planes are aligned along one direction, a perfect orientation. Such a perfectly oriented structure has not been produced even with the HOPF that was produced by subjecting pyrolytic graphite concurrently to an ultra-high temperature (3,400° C.) under an ultra-high pressure (300 Kg/cm$^2$). The highly oriented graphene structure can achieve such a highest degree of perfection with a significantly lower temperature and an ambient (or slightly higher compression) pressure. The structure thus obtained exhibits an in-plane thermal conductivity 1,500-1,700 W/mK, and in-plane electrical conductivity to a range from 13,000 to 17,000 S/cm. Upon impregnation by 1.0-10% by weight of conductor material, the films typically exhibit a thermal conductivity of 1,600-1,750 W/mK, and/or in-plane electrical conductivity to 15,000-20,000 S/cm.

The highly oriented graphene oxide layer can be heat-treated with a temperature program that covers at least the first regime (typically requiring 1-24 hours in this temperature range if the temperature never exceeds 200° C.), more commonly covers the first two regimes (1-4 hours preferred), still more commonly the first three regimes (preferably 0.5-2.0 hours in Regime 3), and most commonly all the 4 regimes (Regime 4, for 0.2 to 1 hour, may be implemented to achieve the highest conductivity).

X-ray diffraction patterns were obtained with an X-ray diffractometer equipped with CuKcv radiation. The shift and broadening of diffraction peaks were calibrated using a silicon powder standard. The degree of graphitization, g, was calculated from the X-ray pattern using the Mering's Eq, $d_{002}=0.3354\ g+0.344\ (1-g)$, where $d_{002}$ is the interlayer spacing of graphite or graphene crystal in nm. This equation is valid only when $d_{002}$ is equal or less than approximately 0.3440 nm. The graphitic film having a $d_{002}$ higher than 0.3440 nm reflects the presence of oxygen-containing functional groups (such as —OH, >O, and —COOH on graphene molecular plane surfaces) that act as a spacer to increase the inter-graphene spacing.

Another structural index that can be used to characterize the degree of ordering of the presently invented graphitic film and conventional graphite crystals is the "mosaic spread," which is expressed by the full width at half maximum of a rocking curve (X-ray diffraction intensity) of the (002) or (004) reflection. This degree of ordering characterizes the graphite or graphene crystal size (or grain size), amounts of grain boundaries and other defects, and the degree of preferred grain orientation. A nearly perfect single crystal of graphite is characterized by having a mosaic spread value of 0.2-0.4. Most of our graphitic films have a mosaic spread value in this range of 0.2-0.4 (if produced with a heat treatment temperature (HTT) no less than 2,500° C. and with a subsequent compression). However, some values are in the range of 0.4-0.7 if the HTT is between 1,000 and 2,500° C., and in the range of 0.7-1.0 if the HTT is between 200 and 1,000° C. Given the same HTT, the mosaic spread values remain substantially unchanged when the graphitic films are impregnated with a conductor material up to approximately 10% by weight, beyond which the values increase with the conductor proportion. It seems that too high a conductor proportion tends to make it more difficult to align the graphene domains.

More details about step (a) are given below: The graphene oxide suspension may be prepared by immersing a graphitic material (in a powder or fibrous form) in an oxidizing liquid to form a reacting slurry in a reaction vessel at a reaction temperature for a length of time sufficient to obtain GO sheets dispersed in a residual liquid. Typically, this residual liquid is a mixture of acid (e.g. sulfuric acid) and oxidizer (e.g. potassium permanganate or hydrogen peroxide). This residual liquid is then washed and replaced with water and/or alcohol to produce a GO dispersion wherein discrete GO sheets (single-layer or multi-layer GO) are dispersed in the fluid. The dispersion is a heterogeneous suspension of discrete GO sheets suspended in a liquid medium and it looks optically opaque and dark (relatively low degree of oxidation) or slightly green and yellowish (if the degree of oxidation is high).

Now, if the GO sheets contain a sufficient amount of oxygen-containing functional groups and the resulting dispersion (suspension or slurry) is mechanically sheared or ultrasonicated to produce individual GO sheets or molecules that are dissolved (not just dispersed) in water and/or alcohol or other polar solvent, we can reach a material state called "GO gel" in which all individual GO molecules are surrounded by the molecules of the liquid medium. The GO gel looks like a homogeneous solution which is translucent and no discernible discrete GO or graphene sheets can be visibly identified. Useful starting graphitic materials include natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. As the oxidizing reaction proceeds to a critical extent and individual GO sheets are fully separated (now with graphene plane and edges being heavily decorated with oxygen-containing groups), an optically transparent or translucent solution is formed, which is the GO gel.

Preferably, the GO sheets in such a GO dispersion or the GO molecules in such a GO gel are in the amount of 1%-15% by weight, but can be higher or lower. More preferably, the GO sheets are 2%-10% by weight in the suspension. Most preferably, the amount of GO sheets is sufficient to form a liquid crystal phase in the dispersing liquid. The GO sheets have an oxygen content typically in the range from 5% to 50% by weight, more typically from 10% to 50%, and most typically from 20% to 46% by weight.

The aforementioned features are further described and explained in detail as follows: As illustrated in FIG. 5(B), a graphite particle (e.g. 100) is typically composed of multiple graphite crystallites or grains. A graphite crystallite is made up of layer planes of hexagonal networks of carbon atoms. These layer planes of hexagonally arranged carbon atoms are substantially flat and are oriented or ordered so as to be substantially parallel and equidistant to one another in a particular crystallite. These layers of hexagonal-structured carbon atoms, commonly referred to as graphene layers, or basal planes, are weakly bonded together in their thickness direction (crystallographic c-axis direction) by weak van der Waals forces and groups of these graphene layers are arranged in crystallites. The graphite crystallite structure is usually characterized in terms of two axes or directions: the c-axis direction and the a-axis (or b-axis) direction. The c-axis is the direction perpendicular to the basal planes. The a- or b-axes are the directions parallel to the basal planes (perpendicular to the c-axis direction).

A highly ordered graphite particle can consist of crystallites of a considerable size, having a length of $L_a$ along the crystallographic a-axis direction, a width of $L_b$ along the crystallographic b-axis direction, and a thickness L, along the crystallographic c-axis direction. The constituent graphene planes of a crystallite are highly aligned or oriented with respect to each other and, hence, these anisotropic structures give rise to many properties that are highly directional. For instance, the thermal and electrical conductivity of a crystallite are of great magnitude along the plane directions (a- or b-axis directions), but relatively low in the perpendicular direction (c-axis). As illustrated in the upper-left portion of FIG. 5(B), different crystallites in a graphite particle are typically oriented in different directions and, hence, a particular property of a multi-crystallite graphite particle is the directional average value of all the constituent crystallites.

Due to the weak van der Waals forces holding the parallel graphene layers, natural graphite can be treated so that the spacing between the graphene layers can be appreciably opened up so as to provide a marked expansion in the c-axis direction, and thus form an expanded graphite structure in which the laminar character of the carbon layers is substantially retained. The process for manufacturing flexible graphite is well-known in the art. In general, flakes of natural graphite (e.g. 100 in FIG. 5(B)) are intercalated in an acid solution to produce graphite intercalation compounds (GICs, 102). The GICs are washed, dried, and then exfoliated by exposure to a high temperature for a short period of time. This causes the flakes to expand or exfoliate in the c-axis direction of the graphite up to 80-300 times of their original dimensions. The exfoliated graphite flakes are vermiform in appearance and, hence, are commonly referred to as worms 104. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite" 106) having a typical density of about 0.04-2.0 g/cm$^3$ for most applications.

Figure 5A:
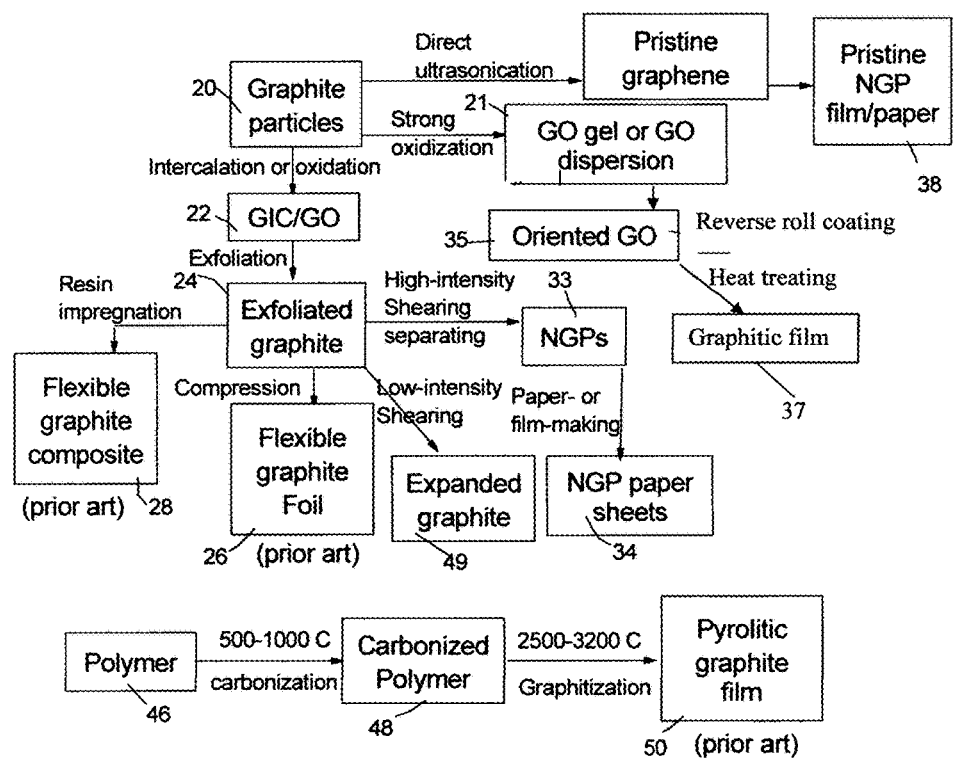
FIG. 5(A) A flow chart illustrating various prior art processes of producing exfoliated graphite products (flexible graphite foils and flexible graphite composites) and pyrolytic graphite (bottom portion), along with a process for producing graphene oxide gel or GO dispersion.
Figure 5B:
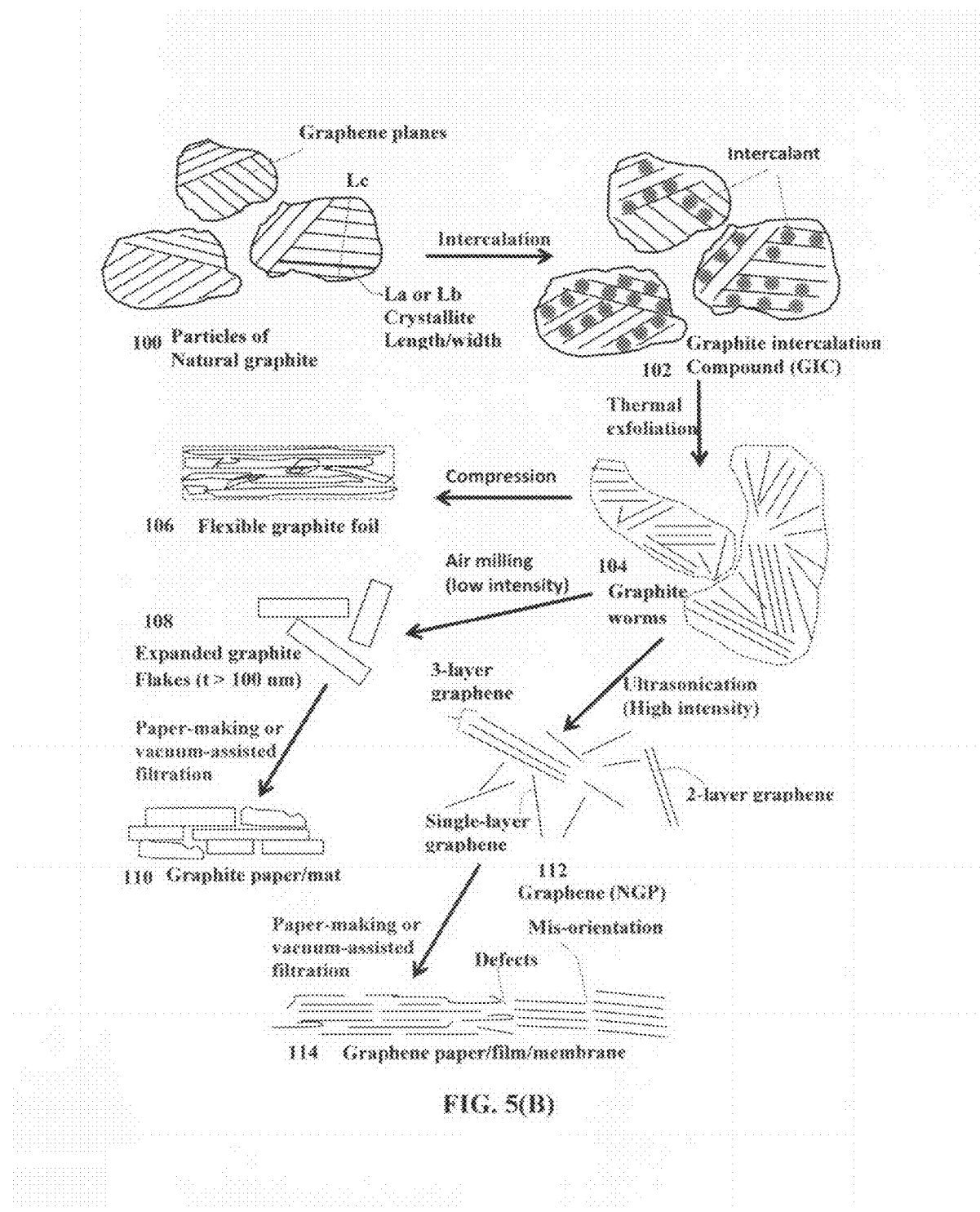
FIG. 5(B) Schematic drawing illustrating the processes for producing conventional paper, mat, film, and membrane of simply aggregated graphite or NGP flakes/platelets. All processes begin with intercalation and/or oxidation treatment of graphitic materials (e.g. natural graphite particles).

The upper left portion of FIG. 5(A) shows a flow chart that illustrates the prior art processes used to fabricate flexible graphite foils and the resin-impregnated flexible graphite composite. The processes typically begin with intercalating graphite particles 20 (e.g., natural graphite or synthetic graphite) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its c-axis direction by a factor of 30 to several hundreds to obtain a worm-like vermicular structure 24 (graphite worm), which contains exfoliated, but un-separated graphite flakes with large pores interposed between these interconnected flakes. An example of graphite worms is presented in FIG. 6(A).

In one prior art process, the exfoliated graphite (or mass of graphite worms) is re-compressed by using a calendaring or roll-pressing technique to obtain flexible graphite foils (26 in FIG. 5(A) or 106 in FIG. 5(B)), which are typically 100-300 µm thick. An SEM image of a cross-section of a flexible graphite foil is presented in FIG. 6(B), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1,000-3,000 S/cm, through-plane (thickness-direction or Z-direction) electrical conductivity of 15-30 S/cm, in-plane thermal conductivity of 140-300 W/mK, and through-plane thermal conductivity of approximately 10-30 W/mK. These defects and mis-orientations are also responsible for the low mechanical strength (e.g. defects are potential stress concentration sites where cracks are preferentially initiated). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength as well. In addition, upon resin impregnation, the electrical and thermal conductivity of the graphite worms could be reduced by two orders of magnitude.

Alternatively, the exfoliated graphite may be subjected to high-intensity mechanical shearing/separation treatments using a high-intensity air jet mill, high-intensity ball mill, or ultrasonic device to produce separated nano graphene platelets 33 (NGPs) with all the graphene platelets thinner than 100 nm, mostly thinner than 10 nm, and, in many cases, being single-layer graphene (also illustrated as 112 in FIG. 5(B)). An NGP is composed of a graphene sheet or a plurality of graphene sheets with each sheet being a two-dimensional, hexagonal structure of carbon atoms.

Further alternatively, with a low-intensity shearing, graphite worms tend to be separated into the so-called expanded graphite flakes (108 in FIG. 5(B) having a thickness >100 nm. These flakes can be formed into graphite paper or mat 106 using a paper- or mat-making process. This expanded graphite paper or mat 106 is just a simple aggregate or stack of discrete flakes having defects, interruptions, and mis-orientations between these discrete flakes.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 µm, but can be larger than 200 µm.

Figure 7A:
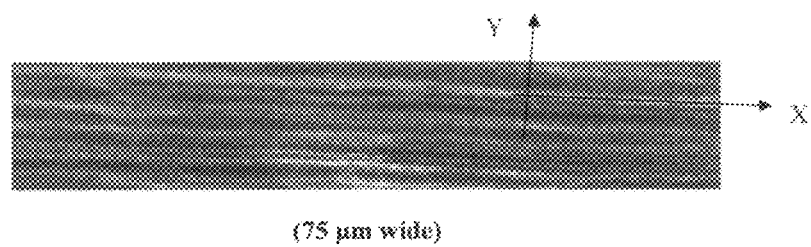
FIG. 7(A) A SEM image of a GO-derived and merged graphitic film, wherein multiple graphene planes (having an initial length/width of 30 nm-300 nm in original graphite particles) have been oxidized, exfoliated, re-oriented, and seamlessly merged into continuous-length graphene sheets or layers that can run for tens of centimeters wide or long (only a 50 μm width of a 10-cm wide graphitic film being shown in this SEM image).
Figure 7B:
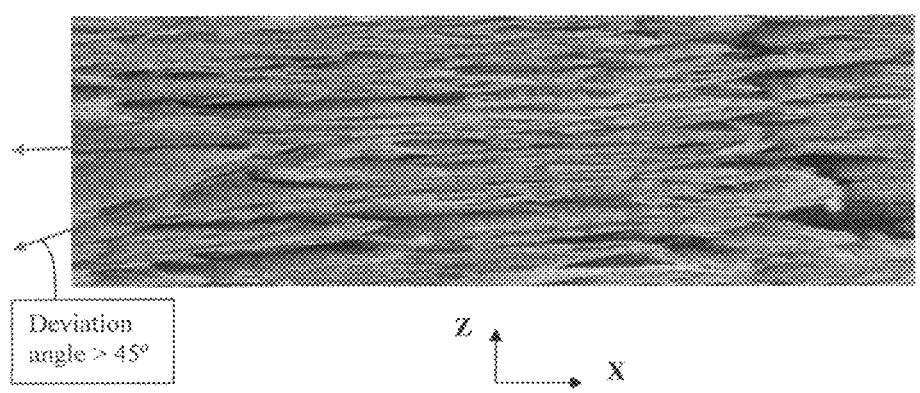
FIG. 7(B) A SEM image of a cross-section of a conventional graphene paper (RGO) prepared from discrete graphene sheets/platelets using a paper-making process (e.g. vacuum-assisted filtration). The image shows many discrete graphene sheets being folded or interrupted (not integrated), with orientations not parallel to the film/paper surface and having many defects or imperfections.

A mass of multiple NGPs (including discrete sheets/platelets of single-layer and/or few-layer graphene or graphene oxide, 33 in FIG. 5(A)) may be made into a graphene film/paper (34 in FIG. 5(A) or 114 in FIG. 5(B)) using a film- or paper-making process. FIG. 7(B) shows a SEM image of a cross-section of a graphene paper/film prepared from discrete graphene sheets using a paper-making process. The image shows the presence of many discrete graphene sheets being folded or interrupted (not integrated), most of platelet orientations being not parallel to the film/paper surface, the existence of many defects or imperfections. NGP aggregates, even when being closely packed, exhibit a thermal conductivity higher than 1,000 W/mK only when the film or paper is cast and strongly pressed into a sheet having a thickness lower than 10 µm. A heat spreader in many electronic devices is normally required to be thicker than 10 µm but thinner than 35 µm).

Another graphene-related product is the graphene oxide gel 21 (FIG. 5(A)). This GO gel is obtained by immersing a graphitic material 20 in a powder or fibrous form in a strong oxidizing liquid in a reaction vessel to form a suspension or slurry, which initially is optically opaque and dark. This optical opacity reflects the fact that, at the outset of the oxidizing reaction, the discrete graphite flakes and, at a later stage, the discrete graphene oxide flakes scatter and/or absorb visible wavelengths, resulting in an opaque and generally dark fluid mass. If the reaction between graphite powder and the oxidizing agent is allowed to proceed at a sufficiently high reaction temperature for a sufficient length of time and all the resulting GO sheets are fully separated, this opaque suspension is transformed into a brown-colored and typically translucent or transparent solution, which is now a homogeneous fluid called "graphene oxide gel" (21 in FIG. 5(A)) that contains no discernible discrete graphite flakes or graphite oxide platelets. If dispensed and deposited using the presently invented reverse roll coating, the GO gel undergoes molecular orientation to form a layer of highly oriented GO 35, which can be heat-treated to become a graphitic film 37.

Again, typically, this graphene oxide gel is optically transparent or translucent and visually homogeneous with no discernible discrete flakes/platelets of graphite, graphene, or graphene oxide dispersed therein. In the GO gel, the GO molecules are uniformly "dissolved" in an acidic liquid medium. In contrast, suspension of discrete graphene sheets or graphene oxide sheets in a fluid (e.g. water, organic acid or solvent) look dark, black or heavy brown in color with individual graphene or graphene oxide sheets discernible or recognizable even with naked eyes or using a low-magnification light microscope (100×-1,000×).

Even though graphene oxide suspension or GO gel is obtained from a graphitic material (e.g. powder of natural graphite) having multiple graphite crystallites exhibiting no preferred crystalline orientation, as determined by an X-ray diffraction or electron diffraction method, the resulting graphitic film exhibits a very high degree of preferred crystalline orientation as determined by the same X-ray diffraction or electron diffraction method. This is yet another piece of evidence to indicate that the constituent graphene planes of hexagonal carbon atoms that constitute the particles of the original or starting graphitic material have been chemically modified, converted, re-arranged, re-oriented, linked or cross-linked, merged and integrated, re-graphitized, and even re-crystallized.

For step (e) of the presently invented process, the conductor material impregnated into small gaps in the heat treated graphitic layer serves to bond the un-connected graphene sheets in the graphitic layer at least in an end-to-end manner. The conductor material may also fill into pores of the porous graphitic film to bridge the interruptions of electron and phonon transport pathways. The conductor material may be selected from a metal, an intrinsically conductive polymer, a conductive organic compound, or a combination thereof.

An electrically conducting polymer is composed of polymer chains having fully conjugated sequences of double bonds along the chains. Examples of intrinsically conducting polymers are poly(fluorene), polyphenylene, polypyrene, polyazulene, polynaphthalene, poly(pyrrole) (PPY), polycarbazole, polyindole, polyazepine, polyaniline (PANI), poly(thiophene) (PT), poly(3,4-ethylenedioxythiophene) (PEDOT), poly(p-phenylene sulfide) (PPS), Poly(acetylene)s (PAC), and poly(p-phenylene vinylene) (PPV). Preferred intrinsically conducting polymers are poly(3,4-ethylenedioxythiophene) (PEDOT), polythiophene, polypyrrole, and polyaniline. The charge in intrinsically conducting polymers is transported along and between polymer molecules via generated charge carriers (e.g., holes, electrons). The electrical conductivity values of these intrinsically conductive polymers are typically in the range of $10^{-4}$ to $10^{+2}$ S/cm. These values are not very high, but the presence of an intrinsically conductive polymer in the gaps and pores of a graphitic film of oriented graphene sheets or grains provide synergistic effects to not just electrical conductivity but also thermal conductivity and mechanical strength.

These conductive polymers may be introduced into the porous graphitic film via several approaches:
(a) in situ polymerization of monomers impregnated: monomer is often of lower viscosity and higher mobility, more capable of flowing and permeating into pores of a porous graphitic film prepared in step (d).
(b) impregnation of polymer-solvent solution followed by solvent removal: These polymers typically can be prepared into some versions that are soluble in either water or an organic solvent to prepare a solution. After impregnation of the solution into the gaps and pores of a porous graphitic film, water or organic solvent is then removed. The polymer is precipitated out and bonds to graphene sheets in the vicinity.
(c) melt impregnation: certain polymers are melt processable, enabling polymer melt to permeate into pore and gaps.

In certain embodiments, the conductor material contains a conductive organic compound selected from coal tar pitch, a derivative of coal tar pitch, petroleum pitch, a derivative of petroleum tar pitch, isotropic pitch, mesophase pitch, a polycyclic aromatic compound, pentacene, anthracene, rubrene, or a combination thereof. These compounds are typically in a liquid state at a temperature below 200° C. or even below room temperature. The pores and gaps of a graphitic film can be filled with such a compound through liquid impregnation or physical vapor infiltration.

The conductor material can contain a metal selected from Ti, V, Cr, Mn, Fe, Co, Ni, Cu, Zn, Zr, Mo, Pd, Ag, Cd, Au, Pt, W, Al, Sn, In, Pb, Bi, an alloy thereof, or a mixture thereof. Any transition metal can be used, but preferably, the metal is selected from Cu, Al, Ti, Sn, Ag, Au, Fe, or an alloy thereof.

The step of impregnating the porous graphitic film with a metal or metal alloy can include an operation of electrochemical deposition or plating, pulse power deposition, solution impregnation, electrophoretic deposition, electroless plating or deposition, metal melt impregnation, metal precursor impregnation, chemical deposition, physical vapor deposition, physical vapor infiltration, chemical vapor deposition, chemical vapor infiltration, sputtering, or a combination thereof. These individual operations per se are well-known in the art. For instance, for electrochemical deposition, one may impose a DC current by connecting the porous graphitic film to one terminal (e.g. negative electrode) and a piece of the desired metal (e.g. Cu, Zn, or Ni) to the opposite terminal (e.g. positive electrode) in an electrochemical chamber (e.g. just a simple bath containing an electrolyte).

Example 1: Preparation of Discrete Oxidized Nano Graphene Platelets (NGPs) or GO Sheets Chopped graphite fibers with an average diameter of 12 μm and natural graphite particles were separately used as a starting material, which was immersed in a mixture of concentrated sulfuric acid, nitric acid, and potassium permanganate (as the chemical intercalate and oxidizer) to prepare graphite intercalation compounds (GICs). The starting material was first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 5-16 hours of reaction, the acid-treated graphite fibers or natural graphite particles were filtered and washed thoroughly with deionized water until the pH level of the solution reached 6. After being dried at 100° C. overnight, the resulting graphite intercalation compound (GIC) or graphite oxide fiber was re-dispersed in water and/or alcohol to form a slurry.

In one sample, 500 grams of the graphite oxide fibers were mixed with 2,000 ml alcohol solution consisting of alcohol and distilled water with a ratio of 15:85 to obtain a slurry mass. Then, the mixture slurry was subjected to ultrasonic irradiation with a power of 200 W for various lengths of time. After 20 minutes of sonication, GO fibers were effectively exfoliated and separated into thin graphene oxide sheets with oxygen content of approximately 23%-31% by weight.

The reverse roll transfer procedure was then followed to make the resulting suspension into thin films and thick films of GO, from 1 to 500 µm in thickness, on a polyethylene terephthalate (PET) film. For comparison purposes, GO layers of a comparable thickness range were also prepared by drop-casting, slot-die, and Comma coating techniques.

For making graphitic films, various GO films were subjected to heat treatments that typically involve an initial thermal reduction temperature of 80-350° C. for 1-8 hours, followed by heat-treating at a final heat treatment temperature (HTT) of 700-2,850° C.

Example 2: Preparation of Single-Layer Graphene Sheets from Meso-Carbon Micro-Beads (MCMBs)

Meso-carbon microbeads (MCMBs) were supplied from China Steel Chemical Co., Kaohsiung, Taiwan. This material has a density of about 2.24 g/cm$^3$ with a median particle size of about 16 µm. MCMB (10 grams) were intercalated with an acid solution (sulfuric acid, nitric acid, and potassium permanganate at a ratio of 4:1:0.05) for 48-96 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was no less than 4.5. The slurry was then subjected ultrasonication for 10-100 minutes to produce GO suspensions. TEM and atomic force microscopic studies indicate that most of the GO sheets were single-layer graphene when the oxidation treatment exceeded 72 hours, and 2- or 3-layer graphene when the oxidation time was from 48 to 72 hours.

The GO sheets contain oxygen proportion of approximately 35%-47% by weight for oxidation treatment times of 48-96 hours. The suspension was then coated onto a PET polymer surface using a reverse roll transfer coating and separately, a comma coating procedure to form oriented GO films. The resulting GO films, after removal of liquid, have a thickness that can be varied from approximately 0.5 to 500 µm.

For making graphitic films, the GO films were then subjected to heat treatments that typically involve an initial thermal reduction temperature of 80-500° C. for 1-5 hours, followed by heat-treating at a second temperature of 1,000-2,850° C. The electric conductivity data of the two series of films, each 20 µm thick, are plotted as a function of final heat treatment temperatures, shown in FIG. 9. These data demonstrate that, quite surprisingly, the GO films prepared by reverse roll coating lead to significantly higher thermal conductivity values as compared to those prepared by comma coating. Both comma coating- and reverse roll coating-made thermal films are dramatically more conductive than flexible graphite foil and corresponding reduced GO paper.

Example 3: Preparation of Graphene Oxide (GO) Suspension and GO Gel from Natural Graphite Graphite oxide was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 µm) were immersed and dispersed in the oxidizer mixture liquid for 48 hours, the suspension or slurry appears and remains optically opaque and dark. After 48 hours, the reacting mass was rinsed with water 3 times to adjust the pH value to at least 3.0. A final amount of water was then added to prepare a series of GO-water suspensions. We observed that GO sheets form a liquid crystal phase when GO sheets occupy a weight fraction >3% and typically from 5% to 15%.

For comparison purposes, we also have prepared GO gel samples by extending the oxidation times to approximately 96 hours. With continued heavy oxidation, the dark-colored, opaque suspension obtained with 48 hours of oxidation turns into a brown-yellowish solution that is translucent upon rinsing with some water.

By dispensing and coating the GO suspension or the GO gel on a PET film, using both reverse roll coating and slot-die coating, and removing the liquid medium from the coated film we obtained a thin film of dried graphene oxide. GO films were then subjected to different heat treatments, which typically include a thermal reduction treatment at a first temperature of 100° C. to 500° C. for 1-10 hours, and at a second temperature of 1,000° C.-2,850° C. for 0.5-5 hours. With these heat treatments, also under a compressive stress, the GO film was transformed into a graphitic film. In several samples, the GO gels were aged at 40-55° C. for 24 hours. We have unexpectedly observed that aged samples lead to a higher degree of GO sheet/molecule orientation, lower heat treatment temperatures required, and higher degree of graphene crystal perfection.

Example 4: Preparation of Polyaniline (an Example of a Conductive Binder to Bond Oriented Graphene Sheets Together)

In a typical procedure, a 0.2 mol aniline monomer was placed in an Erlenmeyer flask containing 600 ml of methylethylketone at room temperature and stirred using a magnetic stirrer. This solution was added with 10 ml of water and 0.1 mol sulfuric acid as a dopant, further added with 10 ml of N-methylpyrrolidinone (NMP) as a doping adjuvant, stirred for 30 min, added with 0.25 mol ammonium persulfate (($NH_4)_2S_2O_8$) and then reacted for 24 hours or longer. It may be noted that when/if the viscosity of the solution was increased and thus the precipitate was produced, 5 wt. % or more of an additional solvent which was not methylethylketone was added based on the total weight of the solution, thus enabling stirring). The reaction solution was filtered, yielding a conductive polymer solution. This conductive polymer solution was used to impregnate porous graphitic film produced by heat-treating a GO gel-derived layer. After impregnation, the graphitic film was typically compressed to form a solid, relatively pore-free film.

Example 5: Preparation of Conductive Polyaniline

In another example, a 0.2 mol aniline monomer was placed in an Erlenmeyer flask containing 600 ml of methylethylketone at room temperature and stirred using a magnetic stirrer. This solution was added with 5 ml of water and 0.25 mol ammonium persulfate (($NH_4$)$_2S_2O_8$) and then reacted for 48 hours or longer. The reaction solution was filtered thus obtaining a base type conductive polymer solution. This solution was further added with 0.05 mol $KMnO_4$, reacted for 24 hours and then filtered, thus obtaining a base type conductive polymer solution. This solution was added with 0.1 mol sulfuric acid as a dopant. The resulting solution was added with 10 ml of ethanol and stirred for 24 hours or longer. When the viscosity of the solution was increased and thus the precipitate was produced, 5 wt % or more of an additional solvent which was not methylethylketone was added based on the total weight of the solution, thus enabling stirring. This solution was filtered, yielding a conductive polymer solution. Using this conductive polymer solution, a film was fabricated and its electrical conductivity was measured (typically 50-110 S/cm). The same solution was used to impregnate various porous graphitic films derived from heat-treated GO gel or GO dispersion layers.

Example 6: Preparation of Conductive Polypyrrole

In yet another example of an intrinsically conductive polymer, a 0.2 mol pyrrole monomer was placed in an Erlenmeyer flask containing 600 ml of methylethylketone at room temperature and stirred using a magnetic stirrer. This solution was added with 10 ml of water and 0.25 mol ammonium persulfate (($NH_4$)$_2S_2O_8$) and then reacted for 48 hours or longer. The reaction solution was filtered thus obtaining a base type conductive polymer solution. This solution was added with 10 ml of NMP, stirred for 1 hour, added with 0.1 mol sulfuric acid as a dopant, further stirred for 24 hours and then filtered, yielding a conductive polymer solution (when the viscosity of the solution was increased and thus the precipitate was produced, 5 wt % or more of an additional solvent which was not methylethylketone was added based on the total weight of the solution, thus enabling stirring). This conductive polymer solution was used to impregnate porous graphitic film to bond together constituent oriented graphene sheets or molecules.

Example 7: Preparation of Conductive Polythiophene

A 0.3 mol thiophene monomer was placed in an Erlenmeyer flask containing 600 ml of methylethylketone at room temperature and stirred using a magnetic stirrer. This solution was added with 5 ml of water and 0.1 mol sulfuric acid as a dopant. This solution was added with 8 g of lithium chloride (LiCl) as a catalyst and 10 ml of NMP as a doping adjuvant, stirred for 30 min, added with 0.3 mol ammonium persulfate (($NH_4$)$_2S_2O_8$), and reacted for 72 hours or longer. The reaction solution was filtered, yielding a conductive polymer solution (when the viscosity of the solution was increased and thus the precipitate was produced, 5 wt. % or more of an additional solvent which was not methylethylketone was added based on the total weight of the solution, thus enabling stirring).

The conductive polymer solution was distilled at 80° C. using a distiller to remove the solvent and the unreacted thiophene, so that the solution was concentrated to ⅓ of the original weight thereof. On a separate basis, the conductive polymer solution concentrated to ⅓ was added with 0.05 mol potassium permanganate as an oxidizer, reacted for 24 hours, and filtered, thus obtaining a conductive polymer solution. These conductive polymer solutions were used to impregnate graphitic films, RGO paper, and flexible graphite sheets.

Example 8: Preparation of Conductive Graphitic Films Composed of Intrinsically Conductive Polymer-Bonded, Well-Aligned Graphene Sheets Intrinsically conductive polymers can be synthesized to be soluble in water or an organic solvent to form a polymer solution which typically flows well. We have also found that these conductive polymer solutions are capable of readily impregnating into pores of the graphitic films prepared with the presently invented process and the solutions also readily wet the pore wall surfaces (made of GO or RGO). We used several different procedures to impregnate a polymer solution into pores of the conductive graphitic film: dipping of a graphitic film in and out of a polymer solution bath, immersion (introducing a continuous-length graphitic film into the polymer solution bath and then emerging from the bath in a roll-to-roll manner), and spraying of polymer solution onto surfaces of graphitic films allowing solution to get sucked into the pores of the graphitic film. Alternatively, some of the monomers (e.g. aniline and pyrrole) can be directly electrochemically polymerized in the pores of the graphitic films if the films are used as an electrode in an electrochemical apparatus. Electrochemical synthesis of conductive polymers is well known in the art.

Example 9: Preparation of Conductive Graphitic Films Composed of Conductive Organic Compound-Bonded, Well-Aligned Graphene Sheets Conductive organic compounds investigated include coal tar pitch and its derivatives, petroleum pitch and its derivatives, isotropic pitch, mesophase pitch, polycyclic aromatic compounds (e.g. naphthalene), pentacene, anthracene, and rubrene, These materials typically have a melting points between 50 and 500° C. and more typically between 100 and 300° C. Hence, impregnation of graphitic films by these species can be readily accomplished by liquid impregnation (melt impregnation or solution impregnation), such as dipping, immersion, and spraying. For those graphitic films prepared by heat-treating GO layers at a temperature from 100 to 3,000° C., these organic compounds readily permeate into the pores and wet the pore walls of the resulting graphitic films. A subsequent heat treatment of the impregnated graphitic film at a temperature of 250-1,500° C. (preferably 350-1,000° C.) can significantly increase the electrical and thermal conductivity of these organic compounds.

Example 10: Preparation of Conductive Films Composed of Metal-Bonded, Well-Aligned Graphene Sheets Several procedures can be used to impregnate metal into the pores of porous graphitic films: electrochemical deposition or plating, pulse power deposition, electrophoretic deposition, electroless plating or deposition, metal melt impregnation (more convenient for lower-melting metals, such as Zn and Sn), metal precursor impregnation (impregnation of metal precursor followed by chemical or thermal conversion of precursor to metal), physical vapor deposition, physical vapor infiltration, chemical vapor deposition, chemical vapor infiltration, and sputtering.

For instance, purified zinc sulphate ($ZnSO_4$) is a precursor to Zn; zinc sulphate can be impregnated into pores via solution impregnation and then converted into Zn via electrolysis. In this procedure zinc sulphate solution is used as electrolyte in a tank containing a lead anode and graphitic film cathode. Current is passed between the anode and cathode and metallic zinc is plated onto the cathodes by a reduction reaction.

Pure metallic Cu was synthesized (inside pores of graphitic films) by the reduction of cupric chloride with hydrazine in the aqueous CTAB solution. The use of ammonia solution for the adjustment of solution pH up to 10 and the use of hydrazine as a reducing agent in a capped reaction chamber are crucial for the synthesis of pure Cu. The reaction solution finally became wine-reddish and its UV/vis absorption spectrum exhibited an absorption band at 574 nm, revealing the formation of metallic Cu.

Cu infiltration can also be achieved with the chemical vapor deposition method using [Cu(OOCC2F5)(L)], L=vinyltrimethylsilane or vinyltriethylsilane as a precursor at a temperature of 400-700° C. The precursor Cu complexes were carried out using a standard Schlenk technique under the Ar atmosphere.

As an example of higher melting point metal, precursor infiltration and chemical conversion can be used to obtain metal impregnation. For instance, the hydrogenolysis of nickelocene can occur through a self-catalyzed process at low temperature (<70° C.) in supercritical carbon dioxide to generate relatively uniform dispersed Ni metal film or particles in the pores of graphitic films. Nickelocene ($NiCp_2$) was used as the precursor and H2 was used as the reducing agent. Coleman-grade $CO_2$ and high-purity $H_2$ were used without further purification. The experiment was carried out in a high-pressure reactor (autoclave).

In a typical experiment, 70-90 mg $NiCp_2$ was loaded into the high-pressure reactor. Following precursor loading, low-pressure fresh $CO_2$ was used to purge the system for 10 min at 70° C. in order to purge air out of the reactor. After purging, high-pressure $CO_2$ was fed into the reactor through a high-pressure syringe pump. The temperature of the supercritical (sc) $CO_2$ solution was stabilized by a heating tape at the dissolving condition (T=70° C., P=17 MPa) for 4 h to form a uniform solution. During $NiCp_2$ dissolution, $H_2$ was fed into another clean, air-free high-pressure manifold vessel at a pressure of 3.5 MPa at 60° C. The vessel was then further charged with fresh $CO_2$ using the high-pressure syringe pump to a pressure of 34.5 MPa. This $H_2/scCO_2$ solution was kept stable at this condition for more than 2 h before being injected into the high-pressure reactor. Upon $H_2/scCO_2$ injection, the pressure in the vessel dropped from 34.5 to 13 MPa, allowing the amount of $H_2$ fed into the reactor to be quantified. The $H_2$ injection process was repeated to obtain a 50-100 molar excess of hydrogen relative to nickelocene in the reactor system. Upon the addition of $H_2$, the $scCO_2$ solution containing $NiCp_2$ maintained a green color and the reaction system was left undisturbed at 70° C., 17 MPa for 7-8 hours. After 7-8 h substantial Ni film deposition in the pores of graphitic films was obtained.

We have found that Zn (melting point=419.5° C.) and Sn (MP=231.9° C.) in the molten state readily permeate into pores or gaps (between graphene sheets or molecules) of the porous graphitic films prepared by heat-treating GO layers.

Example 11: Characterization of Conductive Graphitic Films from GO Gel

Figure 11A:
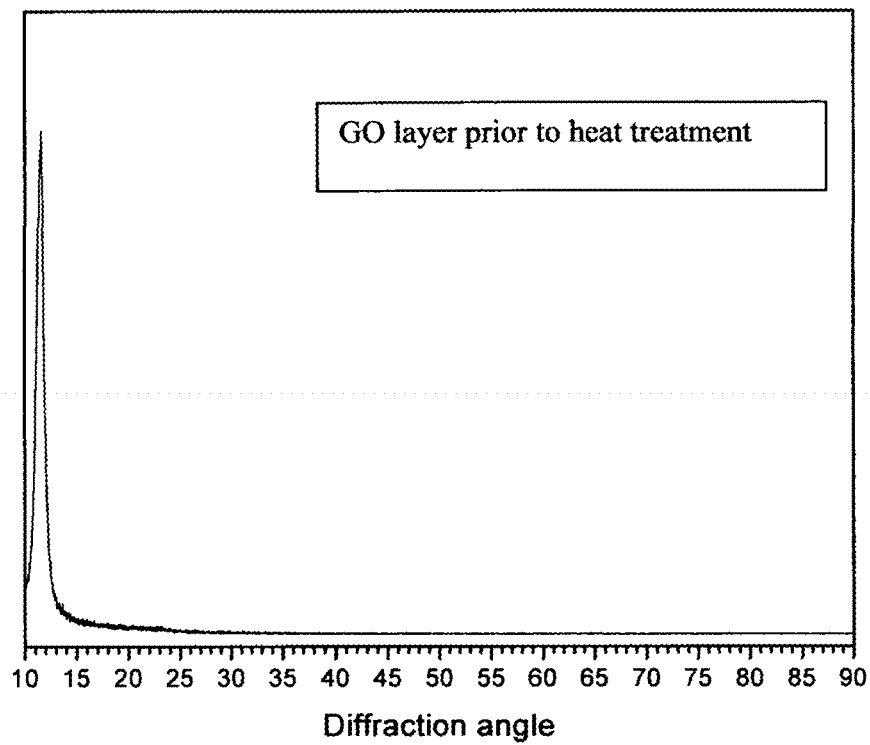
FIG. 11(A) X-ray diffraction curves of a GO layer.
Figure 11B:
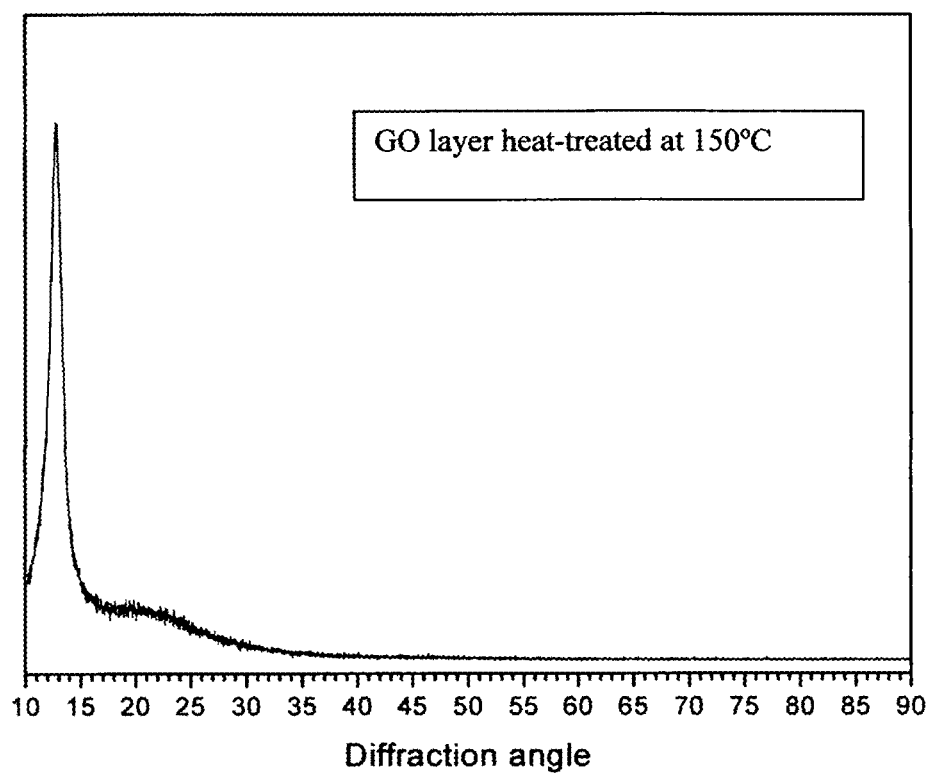
FIG. 11(B) X-ray diffraction curves of GO layer thermally reduced at 150° C. (partially reduced).
Figure 11C:
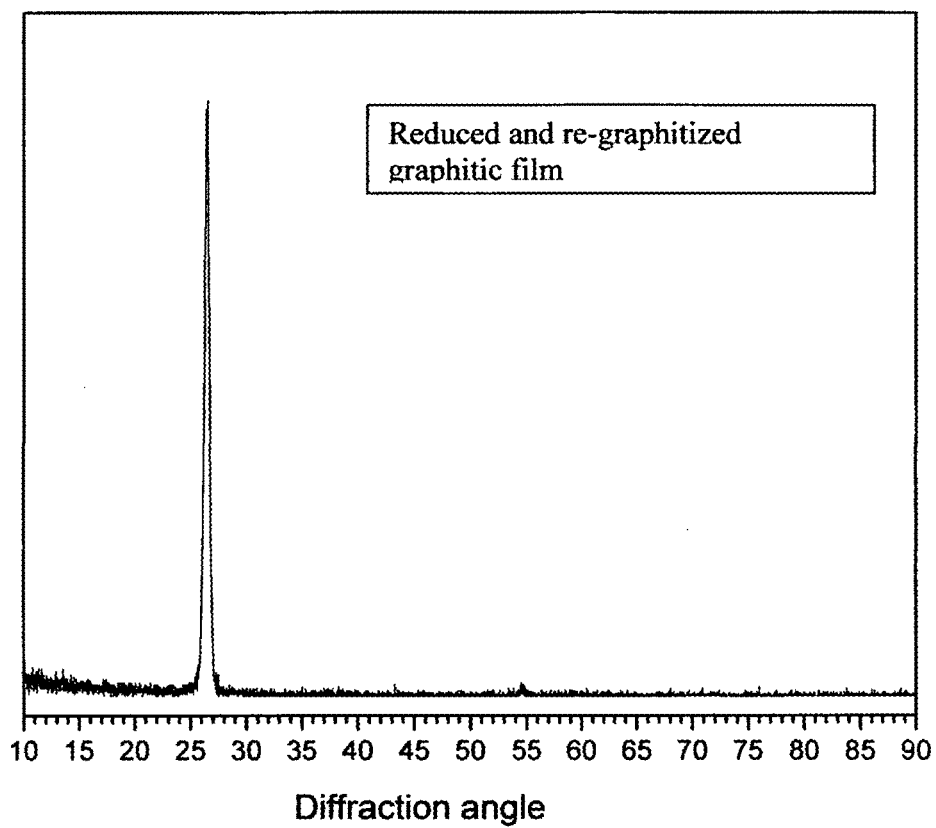
FIG. 11(C) X-ray diffraction curves of reduced and re-graphitized graphitic film.

The internal structures (crystal structure and orientation) of several dried GO layer and the graphitic films at different stages of heat treatments were investigated. X-ray diffraction curves of a layer of dried GO prior to a heat treatment, a GO film thermally reduced at 150° C. for one hour, and a graphitic film are shown in FIGS. 11(A), 11(B), and 11(C), respectively. The peak at approximately $2\theta=12°$ of the dried GO layer (FIG. 11(A)) corresponds to an inter-graphene spacing ($d_{002}$) of approximately 0.7 nm. With some heat treatment at 150° C., the dried GO compact exhibits the formation of a hump centered at 22° (FIG. 11(B)), indicating that it has begun the process of decreasing the inter-graphene spacing, indicating the beginning of chemical linking and ordering processes. With a heat treatment temperature of 2,500° C. for one hour, the $d_{002}$ spacing has decreased to approximately 0.336, close to 0.3354 nm of a graphite single crystal.

Figure 11D:
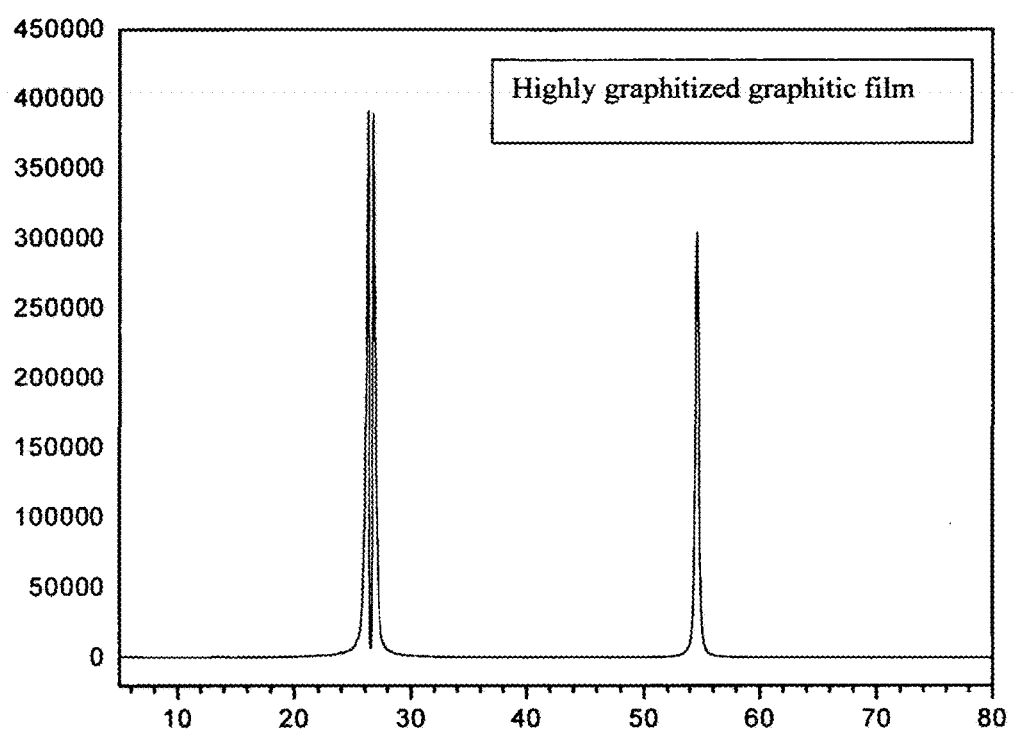
FIG. 11(D) X-ray diffraction curves of highly re-graphitized and re-crystallized graphitic films showing a high-intensity (004) peak.
Figure 11E:
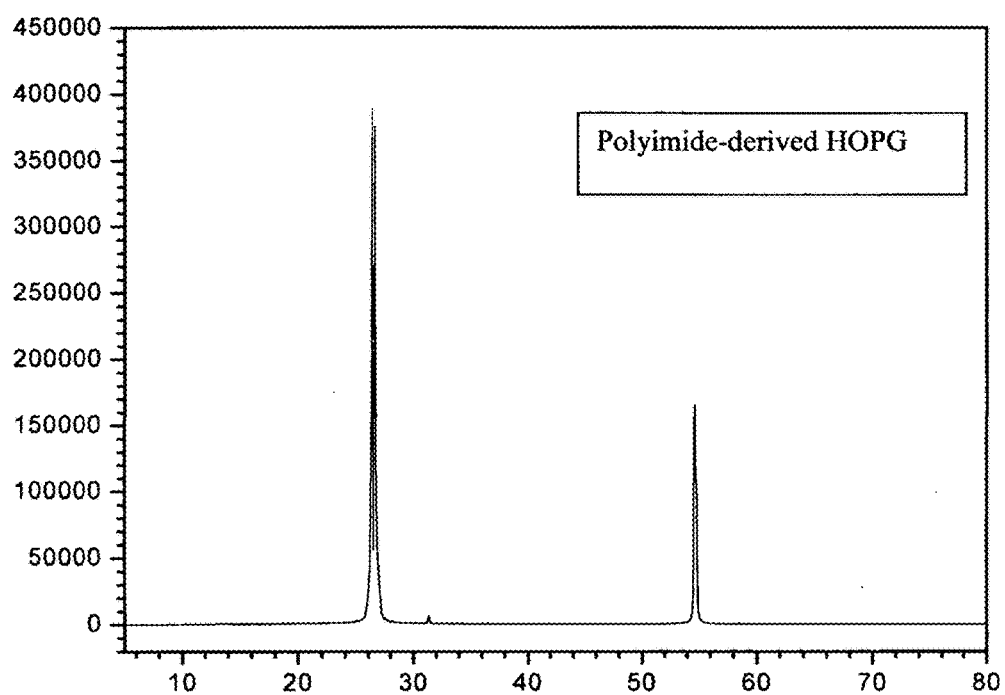
FIG. 11(E) X-ray diffraction curves of a polyimide-derived HOPG with a HTT as high as 3,000° C.

With a heat treatment temperature of 2,750° C. and 2,500° C. for slot-die coated and reverse roll coated films, respectively, for one hour, the $d_{002}$ spacing is decreased to approximately to 0.3354 nm, identical to that of a graphite single crystal. In addition, a second diffraction peak with a high intensity appears at $2\theta=55°$ corresponding to X-ray diffraction from (004) plane (FIG. 11(D)). The (004) peak intensity relative to the (002) intensity on the same diffraction curve, or the I(004)/I(002) ratio, is a good indication of the degree of crystal perfection and preferred orientation of graphene planes. The (004) peak is either non-existing or relatively weak, with the I(004)/I(002) ratio <0.1, for all graphitic materials heat treated at a temperature lower than 2,800° C. The I(004)/I(002) ratio for the graphitic materials heat treated at 3,000-3,250° C. (e.g., highly oriented pyrolytic graphite, HOPG) is in the range of 0.2-0.5. One example is presented in FIG. 11(E) for a polyimide-derived PG with a HTT of 3,000° C. for two hours, which exhibits a I(004)/I (002) ratio of about 0.41. In contrast, a graphitic film prepared with a final HTT of 2,750° C. for one hour exhibits a I/(004)/I(002) ratio of 0.78 and a Mosaic spread value of 0.21, indicating a practically perfect graphene single crystal with an exceptional degree of preferred orientation.

The "mosaic spread" value is obtained from the full width at half maximum of the (002) reflection in an X-ray diffraction intensity curve. This index for the degree of ordering characterizes the graphite or graphene crystal size (or grain size), amounts of grain boundaries and other defects, and the degree of preferred grain orientation. A nearly perfect single crystal of graphite is characterized by having a mosaic spread value of 0.2-0.4. Most of our graphitic films have a mosaic spread value in this range of 0.2-0.4 when produced using a final heat treatment temperature no less than 2,200° C. (reverse roll coating) or no less than 2,500° C. (slot-die coating).

It may be noted that the I(004)/I(002) ratio for all tens of flexible graphite foil compacts investigated are all <<0.05, practically non-existing in most cases. The I(004)/I(002) ratio for all graphene paper/membrane samples prepared with a vacuum-assisted filtration method is <0.1 even after a heat treatment at 3,000° C. for 2 hours. These observations have further confirmed the notion that the presently invented graphitic film is a new and distinct class of material that is fundamentally different from any pyrolytic graphite (PG), flexible graphite (FG), and conventional paper/film/membrane of graphene/GO/RGO sheets/platelets (NGPs).

Figure 12A:
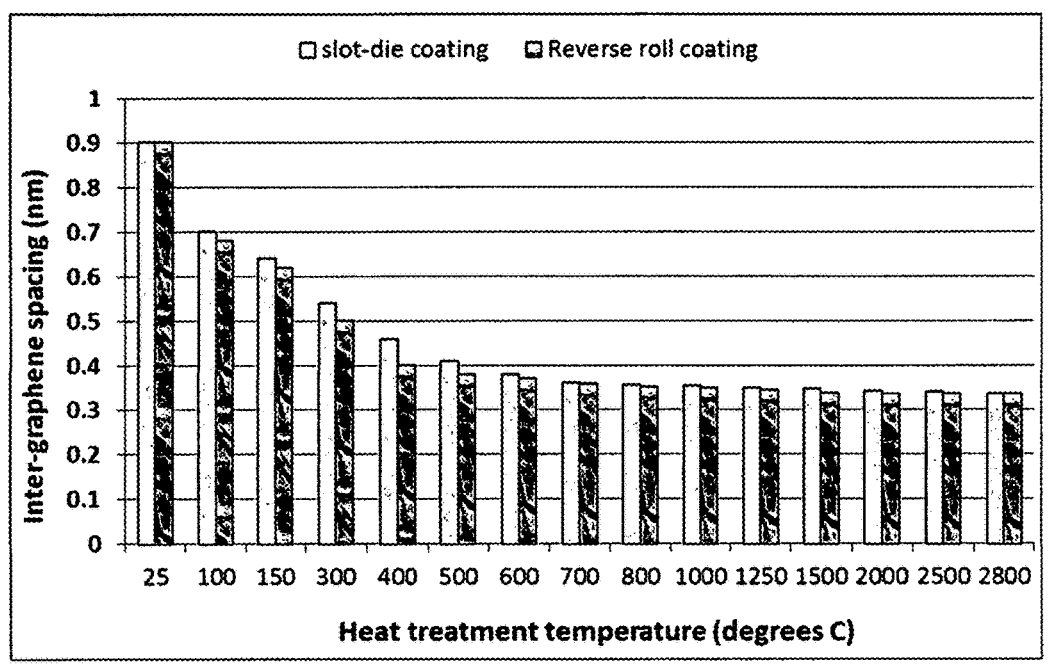
FIG. 12 (A) Inter-graphene plane spacing, measured by X-ray diffraction, of reverse roll-coated GO film- and slot die-coated GO film-derived graphitic films plotted as a function of the heat treatment temperature.
FIG. 12(B) Oxygen content in the GO suspension-derived graphitic films.
FIG. 12(C) Correlation between inter-graphene spacing and the oxygen content.
Figure 12B:
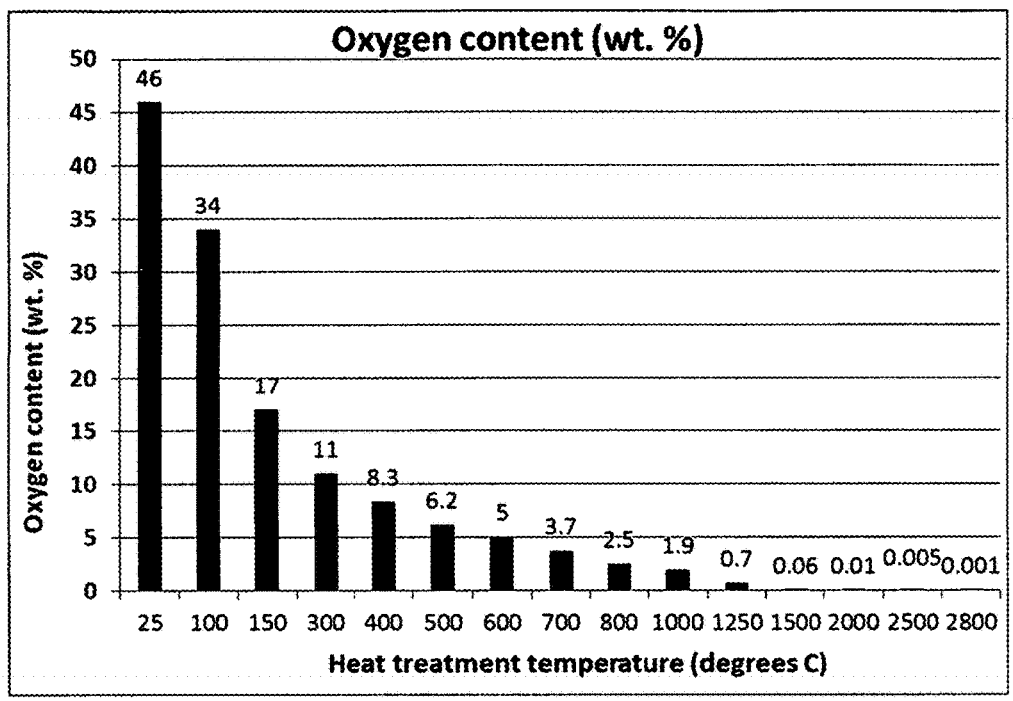
Figure 12C:
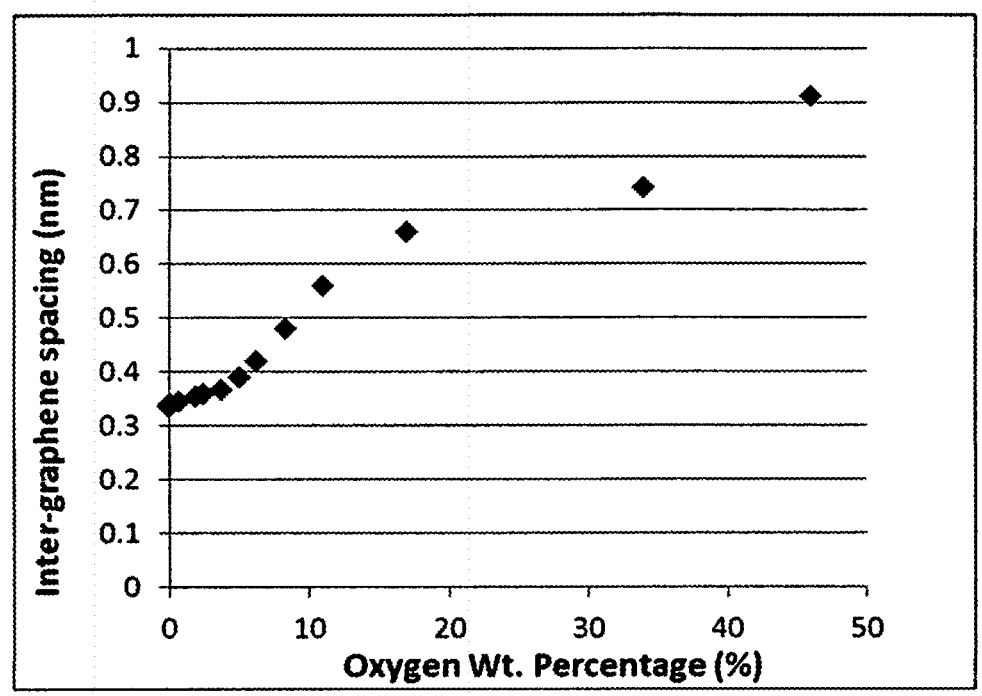

The inter-graphene spacing values of both the GO suspension- and GO gel-derived graphitic film samples obtained by heat treating at various temperatures over a wide temperature range are summarized in FIG. 12(A). Corresponding oxygen content values in the GO suspension-derived unitary graphene layer are shown in FIG. 12(B). In order to show the correlation between the inter-graphene spacing and the oxygen content, the data in FIGS. 12(A) and 12(B) are re-plotted in FIG. 12(C).

Scanning electron microscopy (SEM), transmission electron microscopy (TEM) pictures of lattice imaging of the graphene layer, as well as selected-area electron diffraction (SAD), bright field (BF), and dark-field (DF) images were also conducted to characterize the structure of unitary graphene materials. For measurement of cross-sectional views of the film, the sample was buried in a polymer matrix, sliced using an ultra-microtome, and etched with Ar plasma.

Figure 6A:
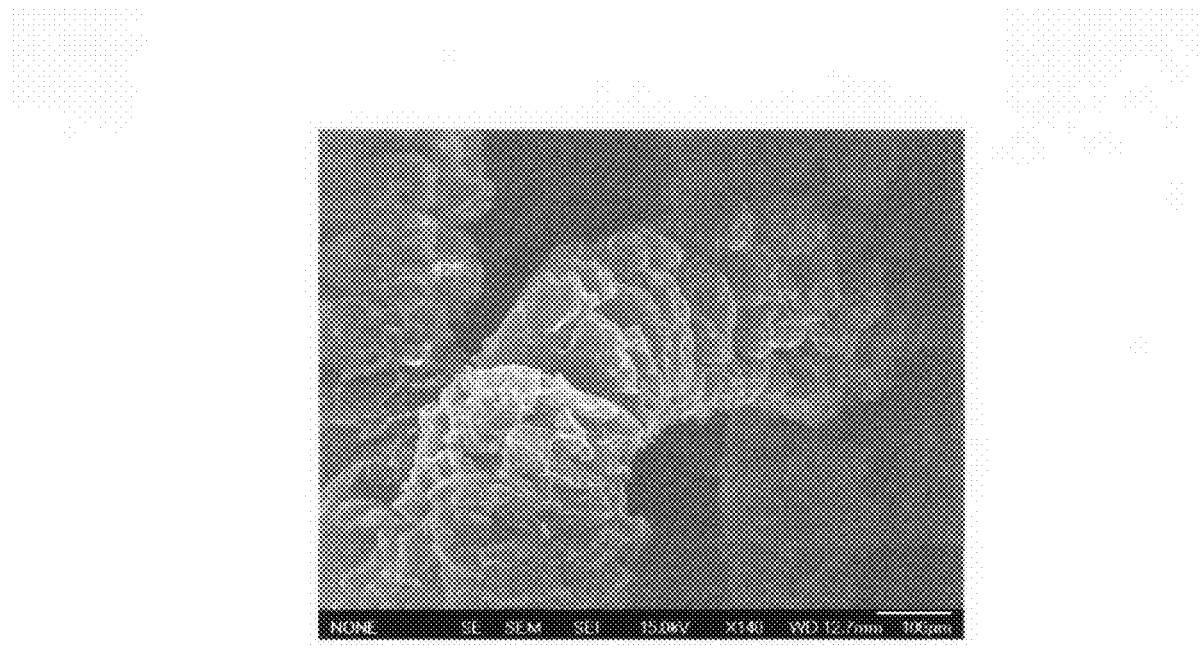
FIG. 6(A) A SEM image of a graphite worm sample after thermal exfoliation of graphite intercalation compounds (GICs) or graphite oxide powders.
Figure 6B:
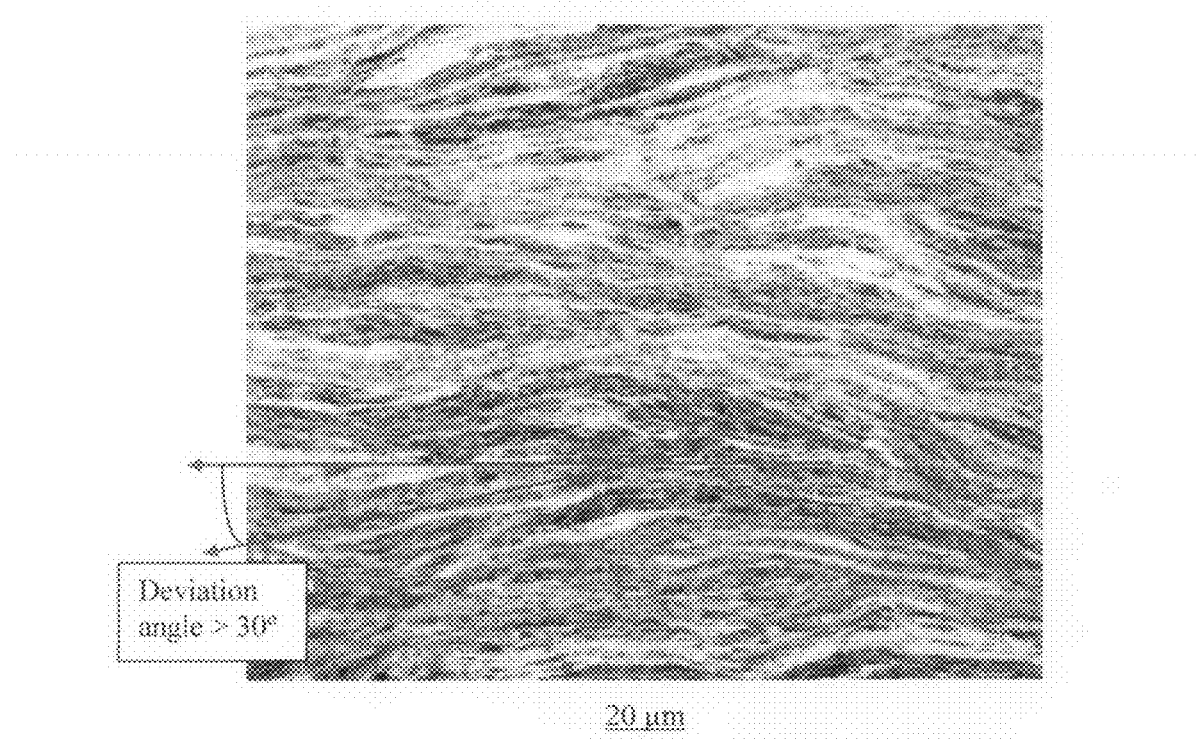
FIG. 6(B) An SEM image of a cross-section of a flexible graphite foil, showing many graphite flakes with orientations not parallel to the flexible graphite foil surface and also showing many defects, kinked or folded flakes.

A close scrutiny and comparison of FIGS. 6(A), 6(A), and 7(B) indicates that the graphene layers in a graphitic film are substantially oriented parallel to one another; but this is not the case for flexible graphite foils and graphene oxide paper. The inclination angles between two identifiable layers in the graphitic film are mostly less than 5 degrees. In contrast, there are so many folded graphite flakes, kinks, and mis-orientations in flexible graphite that many of the angles between two graphite flakes are greater than 10 degrees, some as high as 45 degrees (FIG. 6(B)). Although not nearly as bad, the mis-orientations between graphene platelets in NGP paper (FIG. 7(B)) are also high (average >>10-20°) and there are many gaps between platelets. The graphitic film is essentially gap-free.

Figure 8A:
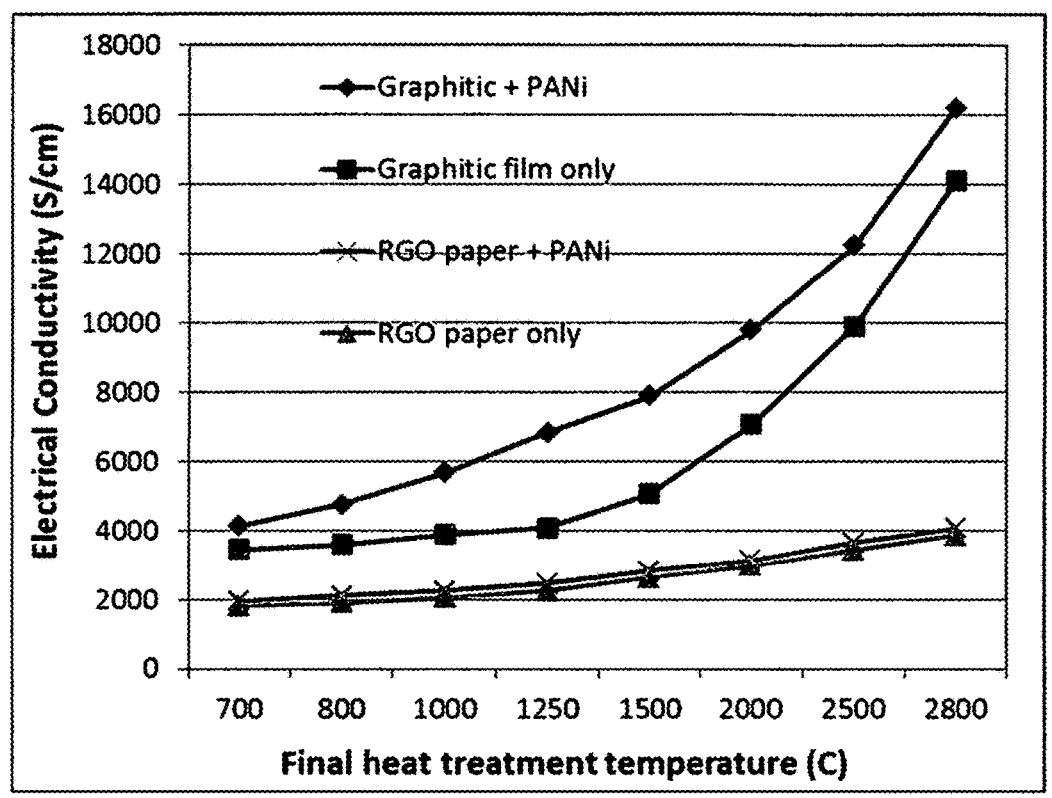
FIG. 8(A) Electrical conductivity values of the GO gel-derived graphitic film (prepared by Comma coating, heat treatment, and compression), similarly made graphitic film with impregnated polyanaline (PANi), RGO platelet paper, and RGO platelet paper impregnated with PANi, all plotted as a function of the final heat treatment temperature.

Example 12: Electric and Thermal Conductivities of Conductive Graphitic Films Derived from GO and their Conductor Materials-Bonded Counterparts FIG. 8(A) shows the electrical conductivity values of the GO gel-derived graphitic film (prepared by Comma coating, heat treatment, and compression), similarly made graphitic film with impregnated polyanaline (10% by wt. PANi), RGO platelet paper, and RGO platelet paper impregnated with PANi, which are all plotted as a function of the final heat treatment temperature. Clearly, with conductive binder (PANi) filling the gaps between otherwise discrete graphene sheets or molecules, the resulting conductor material-bonded graphitic films exhibit significantly higher electrical conductivity as compared to the graphitic film without PANi impregnation. The difference is as much as 200 S/cm. This is very significant and quite unexpected since the electrical conductivity of this PANi (when cast alone into a thin film) exhibits an electrical conductivity only in the range of 10-150 S/cm, yet the electrical conductivity of the graphitic film itself is 14,000 S/cm. According to the well-known "rule-of-mixture law" commonly used in the art of composite materials, the theoretical electric conductivity value of this PANi-filled graphitic film is predicted to be no greater than 14,000×0.90+150×0.10=12,615 S/cm. Contrary to this prediction, the experimental value is approximately 16,000 S/cm. This surprising result appears to be due to the notion that the PANi chains bridge the gaps between graphene sheets/molecules, allowing the electrons in one graphene sheet/molecule to pass through PANi to reach neighboring graphene sheets/molecules without being bounced back. This has effectively increased the mean free paths of electrons (hence, the effective mobility). Such a synergistic effect is truly beneficial and unexpected.

All the prior art work on the preparation of paper or membrane from pristine graphene or graphene oxide sheets/platelets follows distinctly different processing paths, leading to a simple aggregate or stack of discrete graphene/GO/RGO platelets. These simple aggregates or stacks exhibit many folded graphite flakes, kinks, gaps, and mis-orientations, resulting in poor thermal conductivity, low electrical conductivity, and weak mechanical strength. As shown in FIG. 8(A), even at a heat treatment temperature as high as 2,800° C., the sheets of RGO platelet paper exhibits a thermal conductivity less than 4,000 S/cm (for both PANil-impregnated or non-impregnated versions), much lower than the >14,000 S/cm the GO-derived graphitic films and >16,000 S/cm of PANi-bonded versions. These data have clearly demonstrated the superiority of the graphitic film structures produced by coating/casting and subsequent heat treating and their conductive binder-bonded versions in terms of the achievable electric conductivity at a given heat treatment temperature.

Figure 8B:
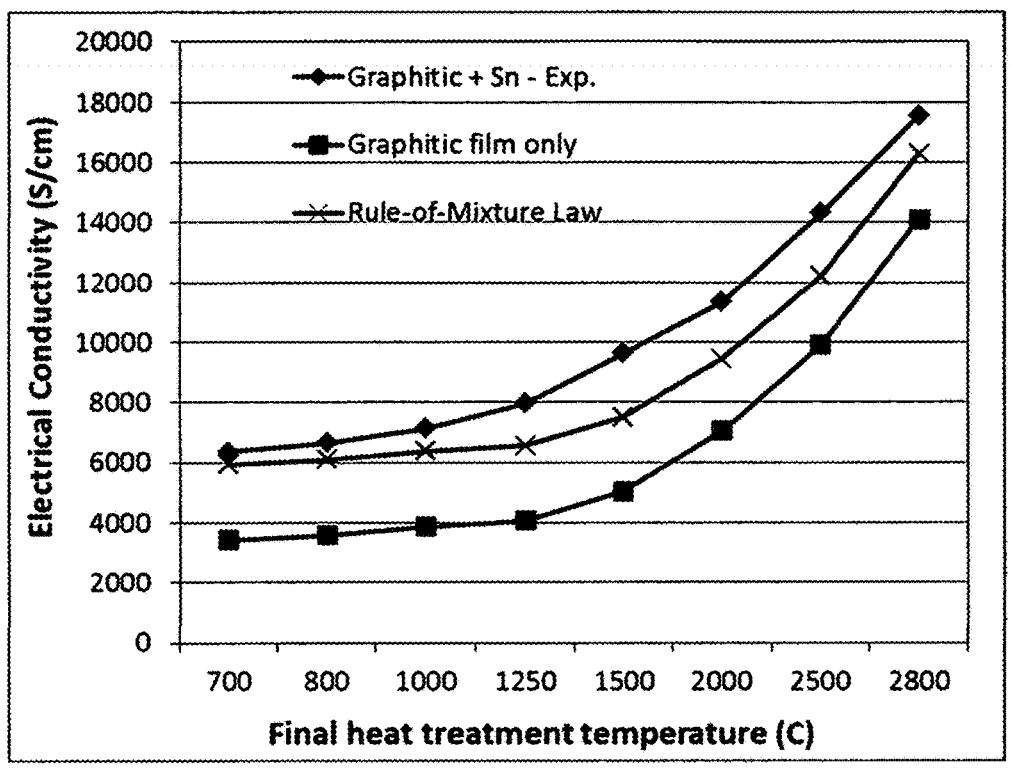
FIG. 8(B) Electrical conductivity values of the GO gel-derived graphitic film, similarly made graphitic film infiltrated with 3% Sn (experimental values), and values based on rule-of-mixture law prediction, all plotted as a function of the final heat treatment temperature.

Similar synergistic effects are observed with metal-bonded graphene based graphitic films. For instance, FIG. 8(B) shows the electrical conductivity values of the GO gel-derived graphitic film, similarly made graphitic film infiltrated with 3% Sn (experimental values), and values based on rule-of-mixture law prediction, all plotted as a function of the final heat treatment temperature. The experimental values are all significantly higher than the values based on rule-of-mixture law prediction.

Figure 8C:
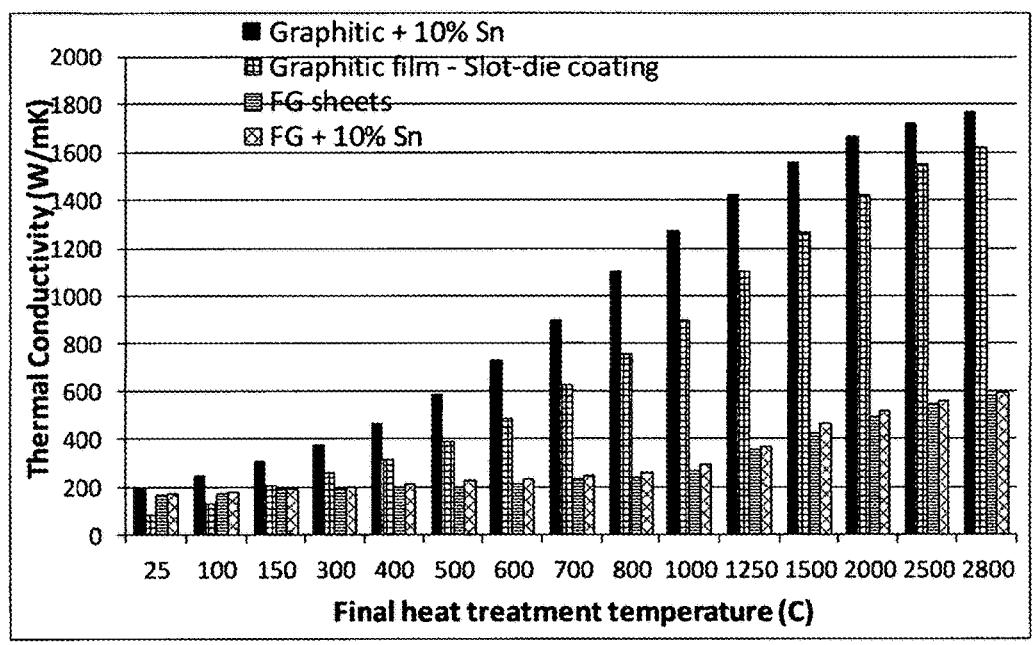
FIG. 8(C) The thermal conductivity of slot die-coated GO gel-derived graphitic films, their Sn-impregnated counterpart (10% Sn by wt.), flexible graphite (FG) foil, and FG foil impregnated with 10% Sn prior to roll-pressing, all plotted as a function of the final heat treatment temperature.

FIG. 8 (C) shows the thermal conductivity of slot die-coated GO gel-derived graphitic films, their Sn-impregnated counterpart (10% Sn by wt.) flexible graphite (FG) foil, and FG foil impregnated with 10% Sn prior to roll-pressing, all plotted as a function of the final heat treatment temperature. All these samples have comparable thickness values. These data again demonstrate the surprising superiority of the presently invented graphitic film composed of conductor-bonded, highly oriented graphene sheets/molecules over a very wide scope of final heat treatment temperatures (from 25° C., untreated, to almost 3,000° C.).

It is of significance to point out that, with a subsequent conductor impregnation, a heat treatment temperature as low as 1,500° C. is sufficient to bring the thermal conductivity of graphitic films to what normally would require a 2,500-3,200° C. treatment to achieve (e.g. 1,400-1,600 W/mK).

In contrast, flexible graphite (FG) sheets, regardless of the final heat treatment temperatures, show significantly lower thermal conductivity values, and impregnation of FG sheets with a conductor imparts limited improvements to the thermal conductivity of these sheets.

Figure 9:
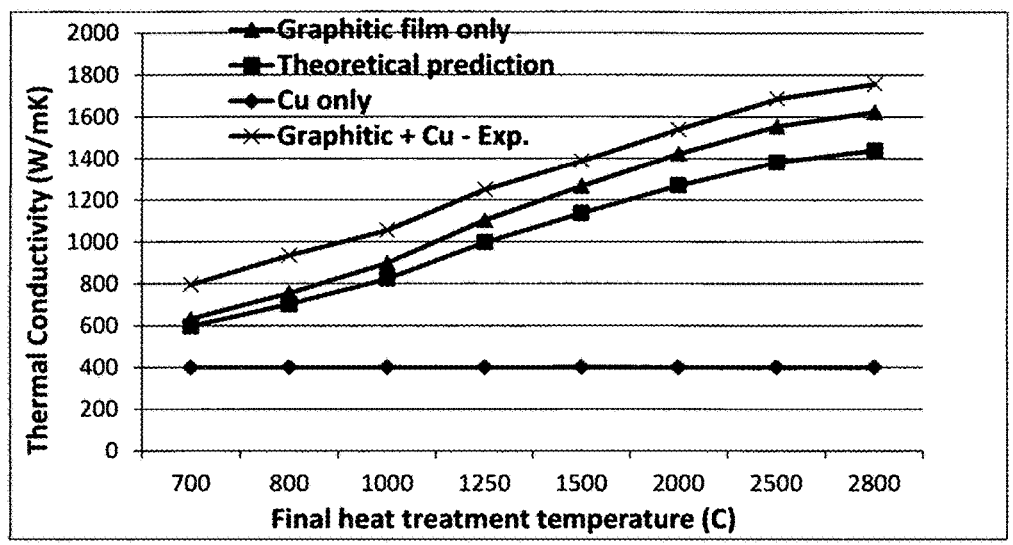
FIG. 9 Thermal conductivity values of the GO dispersion-derived graphitic film (Comma coating), GO dispersion-derived graphitic film impregnated with 15% by weight Cu (Experimental), and values from rule-of-mixture law prediction, all plotted as a function of the final heat treatment temperature; Cu data line is plotted as a baseline (no heat treatment was done to Cu foil).
Figure 10:
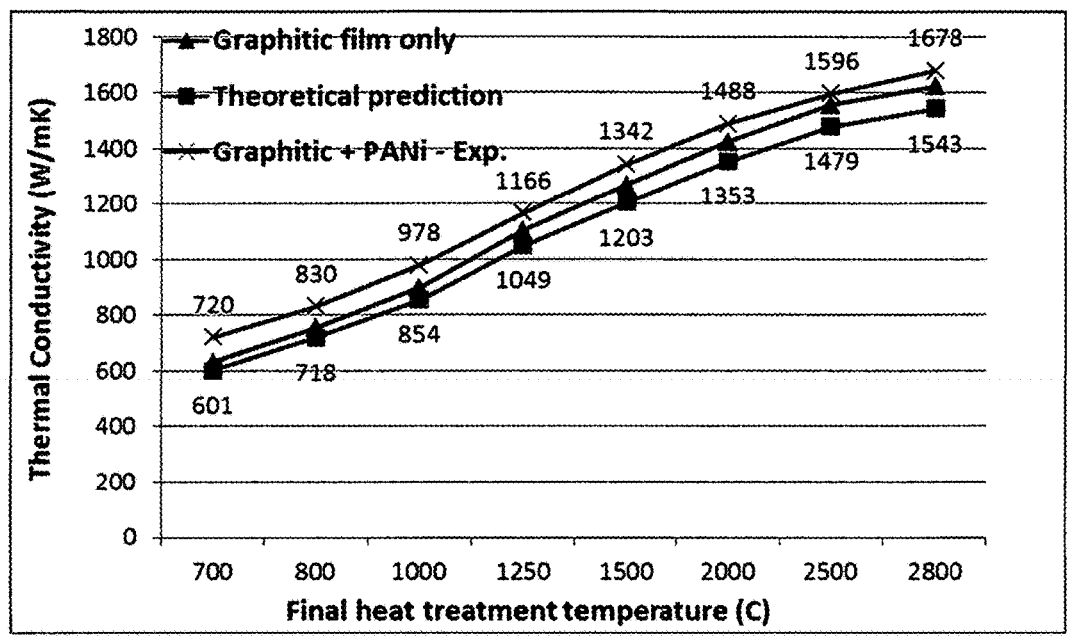
FIG. 10 Thermal conductivity values of the GO dispersion-derived graphitic film, GO dispersion-derived graphitic film impregnated with 5% by weight polyaniline (Experimental), and values from rule-of-mixture law prediction, all plotted as a function of the graphitic film final heat treatment temperature.

More surprising synergistic effects of conductor material binder on the thermal conductivity of graphitic films of instant invention are summarized in FIG. 9 and FIG. 10. These are results of an extensive and in-depth investigation. FIG. 9 shows the thermal conductivity values of the GO dispersion-derived graphitic film (Comma coating), GO dispersion-derived graphitic film impregnated with 15% by weight Cu (Experimental), and values from rule-of-mixture law prediction, all plotted as a function of the final heat treatment temperature; Cu data line is plotted as a baseline (no heat treatment done to Cu foil). FIG. 10 shows the thermal conductivity values of the GO dispersion-derived graphitic film, GO dispersion-derived graphitic film impregnated with 5% by weight polyaniline (Experimental), and values from rule-of-mixture law prediction, all plotted as a function of the graphitic film final heat treatment temperature. All experimental values are significantly higher than theoretically predicted values.

Figure 13A:
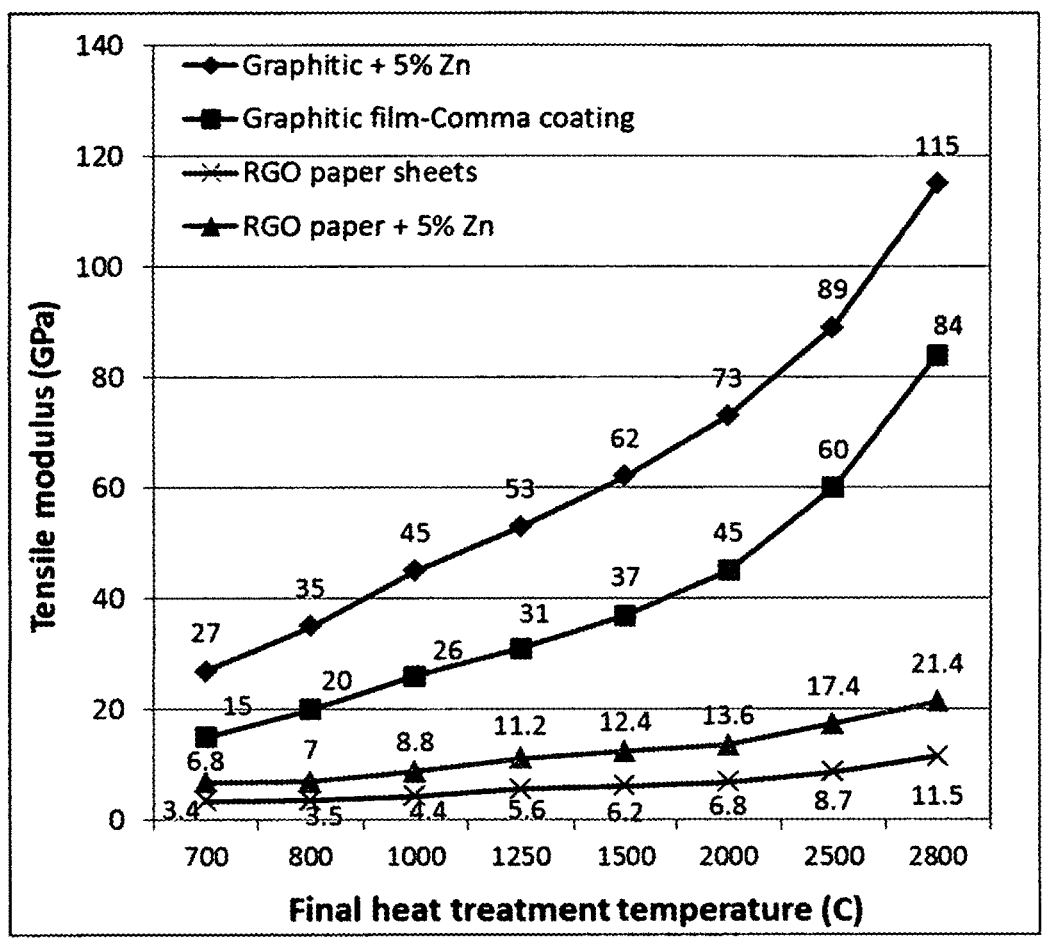
FIG. 13 (A) Tensile modulus of the GO-derived graphitic films, their Zn-impregnated counterparts (5% by wt. Zn), RGO platelet paper, and 5% Zn-impregnated RGO paper.
Figure 13B:
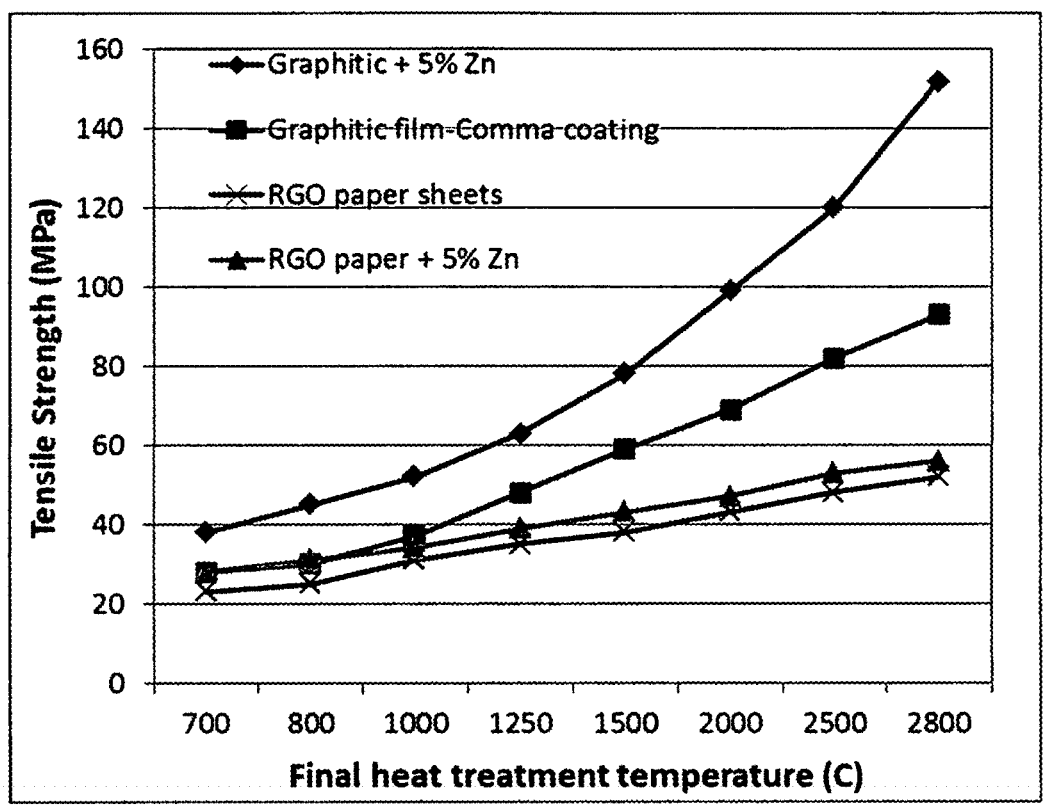

Examples 13: Tensile Strength of Various Graphene Oxide-Derived Graphitic Films and their Conductor-Bonded Versions A series of reverse roll-coated GO gel-derived graphitic films, their metal-impregnated counterparts, RGO paper, and metal-impregnated RGO paper were prepared. A universal testing machine was used to determine the tensile properties of these materials. The tensile modulus and strength of these samples are plotted over a range of heat treatment temperatures. FIG. 13(A) shows the tensile modulus of the GO-derived graphitic films, their Zn-impregnated counterparts (5% by wt. Zn), RGO platelet paper, and 5% Zn-impregnated RGO paper. FIG. 13(B) shows the corresponding tensile strength of the GO-derived graphitic films, their Zn-impregnated counterparts (5% by wt. Zn), RGO platelet paper, and 5% Zn-impregnated RGO paper.

Figure 7C:
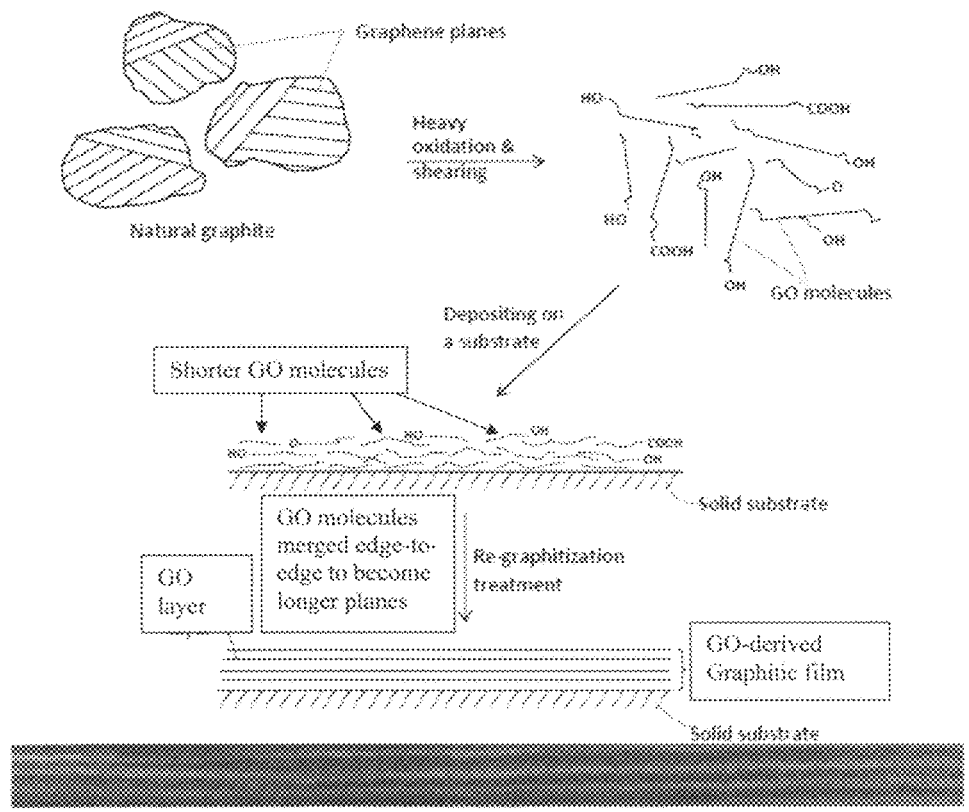
FIG. 7(C) Schematic drawing and an attendant SEM image to illustrate the formation process of a highly oriented graphene film that is composed of multiple graphene planes that are parallel to one another and are chemically bonded in the thickness-direction or crystallographic c-axis direction.
Figure 7D:
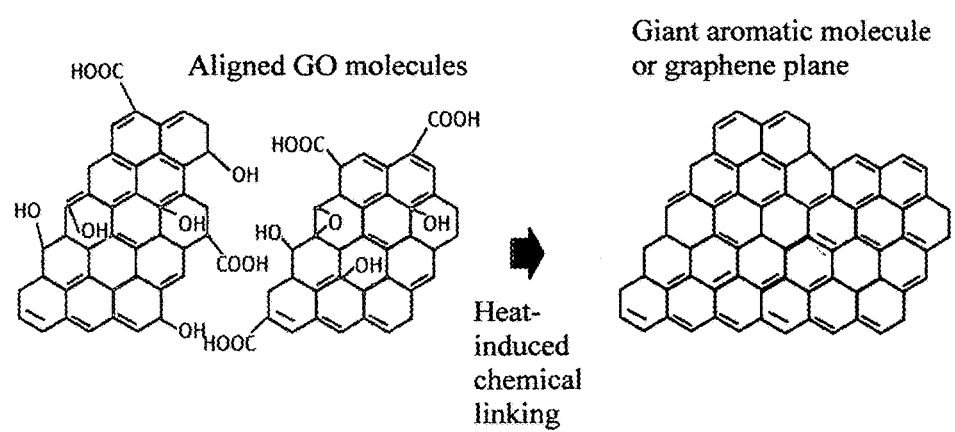
FIG. 7(D) One plausible chemical linking mechanism (only 2 GO molecules are shown as an example; a large number of GO molecules can be chemically linked together to form a graphene layer).

These data have demonstrated that the tensile strength of the RGO paper increases from 23 to 52 MPa when the final heat treatment temperature increases from 700 to 2,800° C. In contrast, the tensile strength of the comma-coated GO gel-derived graphitic films increases significantly from 28 to 93 MPa over the same range of heat treatment temperatures. Most dramatically, the tensile strength of the Zn-impregnated graphitic films increases significantly from 38 to 152 MPa. Similar trends in Young's modulus are also observed. These results are quite striking and further reflects the notion that the GO gel-derived GO layers contain highly live and active GO sheets or molecules during the heat treatment that are capable of chemical linking and merging with other plate-like molecules in an edge-to-edge manner (as illustrated in FIGS. 7(C) and 7(D)), while the graphene platelets in the conventional RGO paper are essentially "dead" platelets. Clearly, the GO-derived graphitic film and its conductor-bonded counterparts are two new classes of materials by themselves.

Example 14: Effect of GO Layer Thickness

Figure 14:
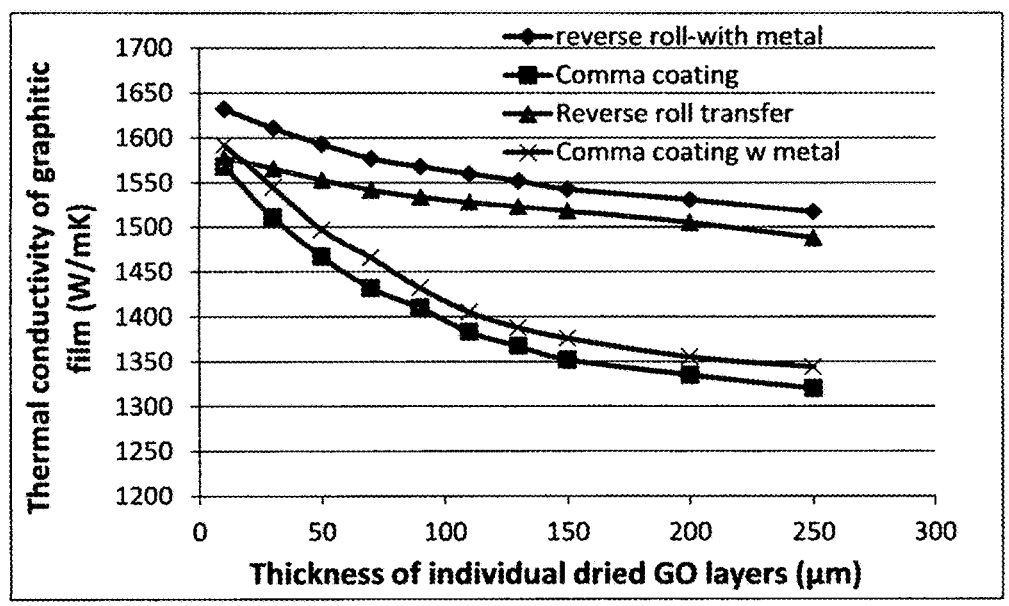
FIG. 14 Thermal conductivity of various graphitic films prepared by comma coating and reverse roll coating of GO layers treated with a final heat treatment temperature of 1,500° C. (followed by Cu impregnation in one series of samples and without Cu impregnation in another series) and compression, all plotted as a function of the thickness value of individual dried GO layers.

FIG. 14 shows the thermal conductivity of various graphitic films prepared by comma coating and reverse roll coating of GO layers treated with a final heat treatment temperature of 1,500° C. (followed by Cu impregnation or without Cu impregnation) and compression, which are all plotted as a function of the thickness value of individual dried GO layers. These results indicate that the graphitic films produced by roll transfer coating (capable of providing a higher degree of graphene sheet orientation) are relatively less dependent upon the layer thickness. (Quite significantly, a small amount of metal impregnation enables the thick film (200 μm, HTT=1,500° C.) to reach very high thermal conductivity (1,350-1,600 W/mK), which normally would require a HTT of 2,500° C. to reach, even for thin polyimide-derived thermal films (e.g. 25 μm).

Example 15: Effect of Conductive Binder Amount

Figure 15:
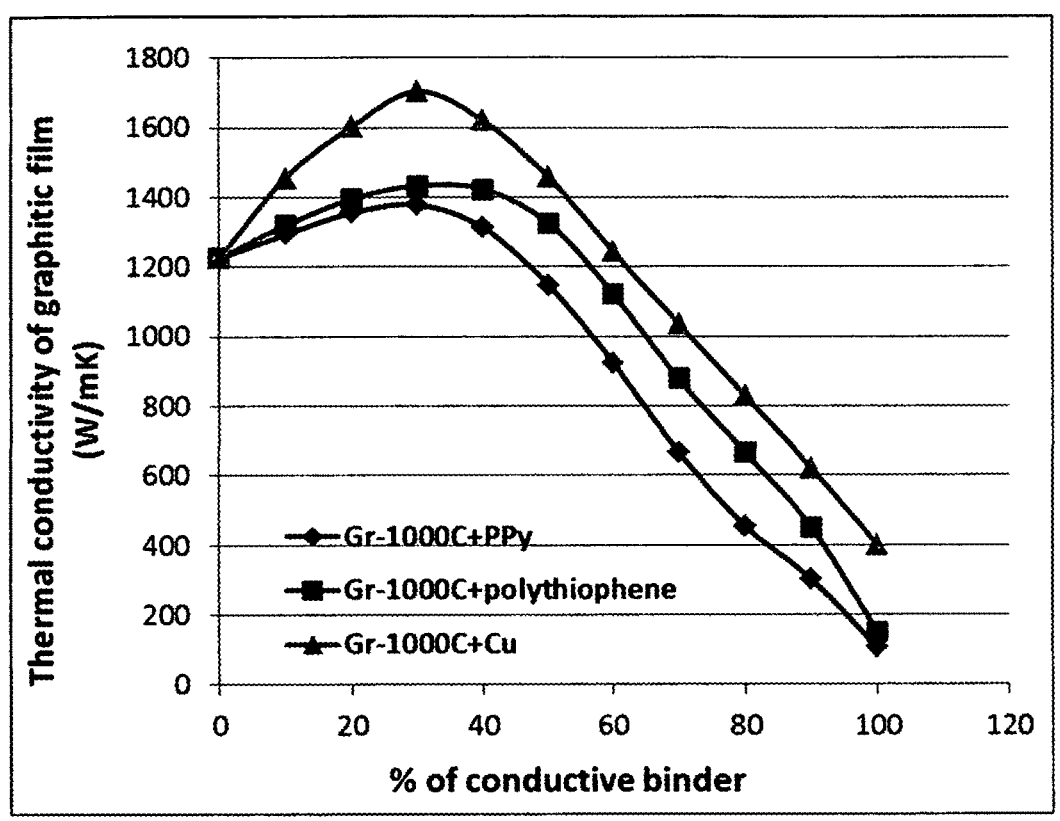
FIG. 15 Thermal conductivity of graphitic films prepared from reverse roll-coated layers heat-treated with a final heat treatment temperature of 1,000° C. and a final thickness of approximately 50 μm, plotted as a function of the proportion of impregnated conductor binder (polypyrrole, polythiophene, and Cu).

Shown in FIG. 15 are the thermal conductivity values of graphitic films prepared from reverse roll-coated layers heat-treated with a final heat treatment temperature of 1,000° C. and a final thickness of approximately 50 μm, plotted as a function of the proportion of impregnated conductor binder (polypyrrole, polythiophene, and Cu). In all examples, synergistic effects (deviation from a straight line) are observed. Maximal thermal conductivity values occur when the conductor binder weight fraction is between 20% and 35%, beyond which the effect of conductor materials (all lower in thermal conductivity than graphene) begin to dominate.

Example 16: Properties of Other Conductor-Bonded Graphitic Films from Graphene Dispersion Additional data related to thermal conductivity of graphitic films composed of various conductor material-bonded, highly oriented graphene sheets (pristine graphene and RGO) are summarized in Table 1 below. These data further demonstrate the surprising superiority of the presently invented graphitic films in imparting thermal conductivity to the graphitic material.

TABLE 1

Thermal conductivity of graphitic films with different conductive binder materials

| Sample ID | Final HTT (° C.) | K (W/mK) no binder | Conductor binder, wt. %, treatment (e.g. heating T) | K (W/mK), with binder |
| --- | --- | --- | --- | --- |
| 31 | 1,000 | 1,135 | Petroleum pitch, 10%, 1,000° C. | 1,245 |
| 32 | 1,500 | 1,250 | Petroleum pitch, 10%, 1,000° C. | 1,385 |
| 33 | 800 | 950 | Coal tar pitch, 15%, 800° C. | 1,060 |
| 34 | 800 | 950 | Coal tar pitch, 15%, 1,000° C. | 1,233 |
| 35 | 800 | 950 | Naphthalene, 15%, 350° C. + 800° C. | 1,120 |
| 36 | 1,250 | 1,188 | Meso pitch, 15%, 350° C. + 800° C. | 1,276 |
| 37 | 1,500 | 1,250 | PEDOT, 7% | 1,410 |
| 38 | 2,500 | 1,560 | Ni, 14% | 1,670 |
| 39 | 1,500 | 1,250 | Ni, 14% | 1,485 |
| 40 | 2,850 | 1,655 | Al, 4% | 1,725 |

In summary, the graphene oxide suspension- or GO gel-derived graphitic films, made by coating or casting followed by heat treatments and conductor binder impregnation, have the following characteristics and advantages:

(1) The graphitic films (thin or thick) are an integrated structure that is typically a poly-crystal having large grains. The graphitic film has wide or long chemically bonded graphene planes that are all essentially oriented parallel to one another. In other words, the crystallographic c-axis directions of all the constituent graphene planes in all grains are essentially pointing in the same direction.

(2) The graphitic film is a fully integrated, essentially void-free structure (after metal impregnation and compression), containing no discrete flakes or platelets that were previously present in the original GO suspension. In contrast, the paper-like sheets of exfoliated graphite worms (i.e., flexible graphite foils), mats of expanded graphite flakes (each flake >100 nm in thickness), and paper or membrane of graphene or GO platelets (each platelet <100 nm) are a simple, un-bonded aggregate/stack of multiple discrete graphite flakes or discrete platelets of graphene, GO, or RGO. The flakes or platelets in these paper/membrane/mats are poorly oriented and have lots of kinks, bends, and wrinkles. Many voids or other defects are present in these paper/membrane/mats. Even after conductive binder material impregnation, the improvements in electrical and thermal conductivity remain limited.

(3) In prior art processes, discrete graphene sheets (<<100 nm, typically <10 nm) or expanded graphite flakes (>100 nm) that constitute the original structure of graphite particles could be obtained via expanding, exfoliating, and separating treatments. By simply mixing and re-compressing these discrete sheets/flakes into a bulk object, one could attempt to orient these sheets/flakes hopefully along one direction through compression. However, with these conventional processes, the constituent flakes or sheets of the resulting aggregate would remain as discrete flakes/sheets/platelets that can be easily discerned or clearly observed even with an un-assisted eye or under a low-magnification optical microscope (×100-×1000).

In contrast, the preparation of the presently invented graphitic films involves heavily oxidizing the original graphite particles, to the extent that practically every one of the original graphene planes has been oxidized and isolated from one another to become individual molecules that possess highly reactive functional groups (e.g. —OH, >O, and —COOH) at the edge and, mostly, on graphene planes as well. These individual hydrocarbon molecules (containing elements such as O and H, in addition to carbon atoms) are dispersed in a liquid medium (e.g. mixture of water and alcohol) to form a GO dispersion. This dispersion is then coated onto a smooth substrate surface, and the liquid components are then removed to form a dried GO layer. When heated, these highly reactive molecules react and chemically join with one another mostly in lateral directions along graphene planes (in an edge-to-edge manner to increase the length and width) and, in some cases, between graphene planes as well.

Illustrated in FIG. 7(D) is a plausible chemical linking mechanism where only 2 aligned GO molecules are shown as an example, although a large number of GO molecules can be chemically linked together to form a graphitic film. Further, chemical linking could also occur face-to-face, not just edge-to-edge. These linking and merging reactions proceed in such a manner that the molecules are chemically merged, linked, and integrated into one single entity. The molecules or "sheets" become dramatically longer and wider. The molecules (GO sheets) completely lose their own original identity and they no longer are discrete sheets/platelets/flakes. There is only one single layer-like structure that is essentially a network of interconnected giant molecules with an essentially infinite molecular weight. This may also be described as a graphene poly-crystal (with several grains, but typically no discernible, well-defined grain boundaries). All the constituent graphene planes are very large in lateral dimensions (length and width) and, if heat-treated at a higher temperature (e.g. >1,000° C. or much higher) and impregnated with a conductive binder material to bridge any gaps or voids, these graphene planes are essentially bonded together with one another along the length or width direction and aligned parallel to one another. Such a structure is conducive to the fast transport of both electrons and phonons, resulting in both high electrical conductivity and high thermal conductivity.

In-depth studies using a combination of SEM, TEM, selected area diffraction, X-ray diffraction, AFM, Raman spectroscopy, and FTIR indicate that the graphitic film is composed of several huge graphene planes (with length/width typically >>100 µm, more typically >>1 mm, and some being >>1 cm). These giant graphene planes are stacked and bonded along the thickness direction (crystallographic c-axis direction) often through not just the van der Waals forces (as in conventional graphite crystallites), but also covalent bonds, if the final heat treatment temperature is lower than 2,000° C. In these cases, wishing not to be limited by theory, but Raman and FTIR spectroscopy studies appear to indicate the co-existence of $sp^2$ (dominating) and $sp^3$ (weak but existing) electronic configurations, not just the conventional $sp^2$ in graphite.

(4) Due to these unique chemical composition, morphology, crystal structure (including inter-graphene spacing), and structural features (e.g. high degree of orientations, chemical bonding, and defects and gaps between graphene sheets being filled with a conductive binder to bridge the interruptions between graphene planes), the highly oriented graphene oxide-derived graphitic film has a unique combination of outstanding thermal conductivity, electrical conductivity, mechanical strength, and stiffness (elastic modulus).

In conclusion, we have successfully developed an absolutely new, novel, unexpected, and patently distinct class of highly conducting and high-strength material: a graphitic film composed of highly oriented graphene sheets/molecules bonded by a conductive binder. The chemical composition (oxygen content), structure (crystal perfection, grain size, reduced defect population, bridged gaps, etc.), crystal orientation, morphology, process of production, and properties of this new class of materials are fundamentally different and patently distinct from flexible graphite foil, polymer-derived pyrolytic graphite, CVD-derived HOPG, and catalytic CVD graphene thin film. The thermal conductivity, electrical conductivity, elastic modulus, and flexural strength exhibited by the presently invented materials are much higher than what prior art flexible graphite sheets, paper of discrete graphene/GO/RGO platelets, or other graphitic materials could possibly achieve. These graphitic films have the best combination of excellent electrical conductivity, thermal conductivity, mechanical strength, and stiffness (modulus). These graphitic films can be used in a wide variety of thermal management applications. For instance, a graphitic film can be part of a thermal management device, such as a heat dissipation film used in a smart phone, tablet computer, flat-panel TV display, or other microelectronic or communications device.

We claim:

1. A process for producing a thermally conducting film of conductor-bonded graphene sheets that are oriented, said process comprising:
   (a) preparing either a graphene dispersion having discrete graphene sheets dispersed in a fluid medium or a graphene oxide gel having graphene oxide molecules dissolved in a fluid medium, wherein said graphene oxide molecules contain an oxygen content from 5% to 50% by weight;
   (b) dispensing and depositing said graphene dispersion or graphene oxide gel onto a surface of supporting solid substrate under a shear stress to form a wet layer of graphene or graphene oxide, having oriented graphene sheets or graphene oxide molecules, on said supporting substrate;
   (c) at least partially removing said fluid medium from the wet layer of graphene or graphene oxide to form a dried layer of graphene, or dried layer of graphene oxide having an inter-planar spacing $d_{002}$ from 0.4 nm to 1.2 nm as determined by X-ray diffraction;
   (d) heat treating the dried layer of graphene or graphene oxide at a heat treatment temperature from 55° C. to 3,200° C. for a desired length of time to produce a porous graphitic film having pores and constituent graphene sheets or a 3D network of graphene pore walls having an inter-planar spacing $d_{002}$ from 0.3354 nm to 0.4 nm, wherein said porous graphitic film has chemically bonded graphene planes that are all essentially oriented parallel to one another; and
   (e) impregnating said porous graphitic film with a liquid or vapor phase metal conductor material or liquid or vapor phase metal conductor material precursor that bonds said constituent graphene sheets or 3D network of graphene pore walls to form said conducting film having a continuous network of electron-conducting and phonon-conducting pathways wherein said conductor material bridge gaps or interruptions in graphene planes, enabling barrier-free transport of electrons and phonons between graphene planes.

2. The process of claim 1, further comprising a step (f) of mechanically compressing or consolidating said conducting film.

3. A process for producing a thermally conducting film of conductor-bonded graphene sheets that are oriented, said process comprising:
(a) preparing either a graphene dispersion having discrete graphene sheets dispersed in a fluid medium or a graphene oxide gel having graphene oxide molecules dissolved in a fluid medium, wherein said graphene oxide molecules contain an oxygen content from 5% to 50% by weight;
(b) dispensing and depositing said graphene dispersion or graphene oxide gel onto a surface of supporting solid substrate under a shear stress to form a wet layer of graphene or graphene oxide, having oriented graphene sheets or graphene oxide molecules, on said supporting substrate;
(c) at least partially removing said fluid medium from the wet layer of graphene or graphene oxide to form a dried layer of graphene, or dried layer of graphene oxide having an inter-planar spacing $d_{002}$ from 0.4 nm to 1.2 nm as determined by X-ray diffraction;
(d) heat treating the dried layer of graphene or graphene oxide at a heat treatment temperature from 55° C. to 3,200° C. for a desired length of time to produce a porous graphitic film having pores and constituent graphene sheets or a 3D network of graphene pore walls having an inter-planar spacing $d_{002}$ from 0.3354 nm to 0.4 nm, wherein said porous graphitic film has chemically bonded graphene planes that are all essentially oriented parallel to one another;
(e) impregnating said porous graphitic film with a conductor material or conductor material precursor that bonds said constituent graphene sheets or 3D network of graphene pore walls to form said conducting film having a continuous network of electron-conducting and phonon-conducting pathways wherein said conductor material bridge gaps or interruptions in graphene planes, enabling barrier-free transport of electrons and phonons between graphene planes and wherein said conductor material or conductor material precursor is selected from an intrinsically conductive polymer, a conductive organic compound, or a combination thereof, wherein said intrinsically conductive polymer is selected from poly(fluorene), polyphenylene, polypyrene, polyazulene, polynaphthalene, polycarbazole, polyindole, polyazepine, poly(3,4-ethylenedioxythiophene) (PEDOT), poly(p-phenylene sulfide) (PPS), poly(acetylene) (PAC), or poly(p-phenylene vinylene) (PPV).

4. The process of claim 1, wherein said liquid or vapor phase metal conductor material or liquid or vapor phase metal conductor material precursor comprises a metal selected from Ti, V, Cr, Mn, Fe, Co, Ni, Cu, Zn, Zr, Mo, Pd, Ag, Cd, Au, Pt, W, Al, Sn, In, Pb, Bi, an alloy thereof, or a mixture thereof.

5. The process of claim 1, wherein said liquid or vapor phase metal conductor material or liquid or vapor phase metal conductor material precursor comprises a metal selected from Cu, Al, Ti, Sn, Ag, Au, Fe, or an alloy thereof.

6. A process for producing a thermally conducting film of conductor-bonded graphene sheets that are oriented, said process comprising:
(a) preparing either a graphene dispersion having discrete graphene sheets dispersed in a fluid medium or a graphene oxide gel having graphene oxide molecules dissolved in a fluid medium, wherein said graphene oxide molecules contain an oxygen content from 5% to 50% by weight;
(b) dispensing and depositing said graphene dispersion or graphene oxide gel onto a surface of supporting solid substrate under a shear stress to form a wet layer of graphene or graphene oxide, having oriented graphene sheets or graphene oxide molecules, on said supporting substrate;
(c) at least partially removing said fluid medium from the wet layer of graphene or graphene oxide to form a dried layer of graphene, or dried layer of graphene oxide having an inter-planar spacing $d_{002}$ from 0.4 nm to 1.2 nm as determined by X-ray diffraction;
(d) heat treating the dried layer of graphene or graphene oxide at a heat treatment temperature from 55° C. to 3,200° C. for a desired length of time to produce a porous graphitic film having pores and constituent graphene sheets or a 3D network of graphene pore walls having an inter-planar spacing $d_{002}$ from 0.3354 nm to 0.4 nm, wherein said porous graphitic film has chemically bonded graphene planes that are all essentially oriented parallel to one another;
(e) impregnating said porous graphitic film with a conductor material or conductor material precursor that bonds said constituent graphene sheets or 3D network of graphene pore walls to form said conducting film having a continuous network of electron-conducting and phonon-conducting pathways wherein said conductor material bridges gaps or interruptions in graphene planes, enabling barrier-free transport of electrons and phonons between graphene planes and wherein said conductor material or conductor material precursor contains a conductive organic compound selected from isotropic pitch, mesophase pitch, a polycyclic aromatic compound, pentacene, anthracene, rubrene, or a combination thereof.

7. The process of claim 1, wherein said conductor material occupies a weight fraction of 0.1%-50% based on the total weight of said conducting film.

8. The process of claim 1, wherein said conductor material occupies a weight fraction of 1%-20% based on the total weight of said conducting film.

9. The process of claim 1, wherein said conductor material bonds said constituent graphene sheets at least in an end-to-end manner, or said conductor material fills into pores of said porous graphitic film.

10. The process of claim 1, wherein said dispensing and depositing step includes an operation of spraying, casting, printing, coating, or a combination thereof.

11. The process of claim 10, wherein said coating operation includes spin coating, dip coating, immersion dip coating, air knife coating, Anilox coating, Flexo coating, gap coating or knife-over-roll coating, gravure coating, metering-rod coating, kissing coating, slot-die coating, slot-die bead coating, slide coating, tensioned-web slot die coating, roller coating, silk screen coating, rotary screen coating, extrusion coating, comma coating, curtain coating, or a combination thereof.

12. The process of claim 10, wherein said coating operation includes slot-die coating, comma coating, or reverse roll transfer coating, or said casting operation includes spin casting, spray casting, or combined casting-coating.

13. The process of claim 1, wherein said heat treatment temperature is from 80 to 1,500° C.

14. The process of claim 1, wherein said step of impregnating said porous graphitic film with a conductor material includes an operation of electrochemical deposition or plating, pulse power deposition, solution impregnation, electrophoretic deposition, electroless plating or deposition, metal melt impregnation, metal precursor impregnation, chemical deposition, physical vapor deposition, physical vapor infiltration, chemical vapor deposition, chemical vapor infiltration, sputtering, or a combination thereof.

15. The process of claim 1, wherein said step of impregnating said porous graphitic film with a conductor material and said step of heat treating are conducted concurrently.

16. The process of claim 1, further comprising a step of aging said wet or dried layer of graphene oxide at an aging temperature from 25° C. to 100° C. and a humidity level from 20% to 99% for an aging time of 1 hour to 7 days to form an aged layer of graphene oxide prior to said step (d) of heat treating.

17. The process of claim 1, wherein said step (d) of heat treating is conducted for a length of time sufficient for decreasing an inter-plane spacing $d_{002}$ to a value of from 0.3354 nm to 0.36 nm and decreasing the oxygen content to less than 2% by weight in said graphitic film.

18. The process of claim 1, wherein said fluid medium consists of water and/or an alcohol.

19. The process of claim 1, wherein said graphene sheets in said graphene dispersion occupy a weight fraction of 0.1% to 25% based on the total weight of graphene sheets and liquid medium combined.

20. The process of claim 1, wherein said graphene oxide molecules in said graphene oxide gel occupy a weight fraction of 0.5% to 15% based on the total weight of graphene oxide molecules and liquid medium combined.

21. The process of claim 19, wherein said graphene sheets in said graphene dispersion occupy a weight fraction of 3% to 15% based on the total weight of graphene sheets and liquid medium combined.

22. The process of claim 1, wherein said graphene dispersion or graphene oxide gel has greater than 3% by weight of graphene or graphene oxide dispersed or dissolved in said fluid medium to form a liquid crystal phase.

23. The process of claim 1, wherein said conducting film has a thickness from 10 nm to 500 µm.

24. The process of claim 1, wherein said conducting film has a thickness from 100 nm to 100 µm.

25. The process of claim 1, wherein said graphene dispersion or graphene oxide gel is prepared by immersing a graphitic material in a powder or fibrous form in an oxidizing liquid in a reaction vessel at a reaction temperature for a length of time sufficient to obtain said graphene oxide dispersion or said graphene oxide gel wherein said graphitic material is selected from natural graphite, artificial graphite, mesophase carbon, mesophase pitch, mesocarbon microbead, soft carbon, hard carbon, coke, carbon fiber, carbon nanofiber, carbon nanotube, or a combination thereof.

26. The process of claim 3, wherein said heat treatment temperature contains a temperature in the range of 500° C.-1,500° C. and the graphitic film has an oxygen content less than 1%, an inter-graphene spacing from 0.3354 nm to 0.345 nm, a thermal conductivity from 1,000 W/mK to 1,750 W/mK, and/or an electrical conductivity from 3,000 S/cm to 20,000 S/cm.

27. The process of claim 6, wherein said heat treatment temperature contains a temperature in the range of 1,500° C.-2,200° C. and the graphitic film has an oxygen content less than 0.01%, an inter-graphene spacing from 0.337 nm, a thermal conductivity from 1,300 W/mK to 1,750 W/mK, and/or an electrical conductivity from 5,000 S/cm to 20,000 S/cm.

28. The process of claim 1, wherein said heat treatment temperature contains a temperature from 2,500° C. to 3,250° C. and the graphitic film has an oxygen content no greater than 0.001%, an inter-graphene spacing from 0.3354 nm to 0.336 nm, a mosaic spread value from 0.2 to 0.7, a thermal conductivity from 1,500 W/mK to 1,750 W/mK, and/or an electrical conductivity from 10,000 S/cm to 20,000 S/cm.

29. The process of claim 1, wherein the porous graphitic film exhibits an inter-graphene spacing from 0.3354 nm to 0.337 nm and a mosaic spread value from 0.2 to 1.0.

30. The process of claim 3, wherein the porous graphitic film exhibits a degree of graphitization no less than 80% and/or a mosaic spread value from 0.2 to 0.4.

31. The process of claim 1, wherein the porous graphitic film exhibits a degree of graphitization no less than 90% and/or a mosaic spread value from 0.2 to 0.4.

32. The process of claim 1, wherein said graphene dispersion or graphene oxide gel is obtained from a graphitic material having a maximum original graphite grain size and said graphitic film is a poly-crystal graphene structure having a grain size larger than said maximum original graphite grain size.

33. The process of claim 1, wherein said graphene dispersion or graphene oxide gel is obtained from a graphitic material having multiple graphite crystallites exhibiting random crystalline orientation as determined by an X-ray diffraction or electron diffraction method and wherein said graphitic film is a single crystal or a poly-crystal graphene structure having a non-random crystalline orientation as determined by said X-ray diffraction or electron diffraction method.

34. The process of claim 1, wherein said step of heat-treating induces chemical linking, merging, or chemical bonding of graphene oxide molecules in an edge-to-edge manner.

* * * * *